(12) United States Patent
Madhiwala et al.

(10) Patent No.: US 12,227,835 B2
(45) Date of Patent: *Feb. 18, 2025

(54) SELECTIVE DEPOSITION OF MATERIAL COMPRISING SILICON AND OXYGEN USING PLASMA

(71) Applicant: ASM IP Holding, B.V., Almere (NL)

(72) Inventors: Viraj Madhiwala, Helsinki (FI); Daniele Chiappe, Espoo (FI); Eva Tois, Espoo (FI); Marko Tuominen, Helsinki (FI); Charles Dezelah, Helsinki (FI); Shaoren Deng, Ghent (BE); Anirudhan Chandrasekaran, Scottsdale, AZ (US); YongGyu Han, Seoul (KR); Michael Givens, Oud-Heverlee (BE); Andrea Illiberi, Leuven (BE); Vincent Vandalon, Heverlee (BE)

(73) Assignee: ASM IP Holding B.V., Almere (NL)

( * ) Notice: Subject to any disclaimer, the term of this patent is extended or adjusted under 35 U.S.C. 154(b) by 0 days.

This patent is subject to a terminal disclaimer.

(21) Appl. No.: 18/050,114

(22) Filed: Oct. 27, 2022

(65) Prior Publication Data

US 2023/0140367 A1 May 4, 2023

Related U.S. Application Data

(60) Provisional application No. 63/273,516, filed on Oct. 29, 2021.

(51) Int. Cl.
*C23C 16/00* (2006.01)
*C23C 16/40* (2006.01)
(Continued)

(52) U.S. Cl.
CPC ...... *C23C 16/401* (2013.01); *C23C 16/45536* (2013.01); *H01J 37/32816* (2013.01); *H01J 2237/182* (2013.01); *H01J 2237/332* (2013.01)

(58) Field of Classification Search
CPC ..................................................... C23C 16/00
See application file for complete search history.

(56) References Cited

U.S. PATENT DOCUMENTS 8,956,971 B2   2/2015   Haukka et al.
9,257,303 B2   2/2016   Haukka et al.
(Continued)

FOREIGN PATENT DOCUMENTS

WO        2018213018 A1      11/2018

OTHER PUBLICATIONS

"Characteristics of Aluminum Silicate Films Grown by Plasma-Enhanced Atomic Layer Deposition", Electrochemical and Solid-State Letters, 8 (9) F25-F28, (Year: 2005).*
(Continued)

*Primary Examiner* — Kelly M Gambetta
*Assistant Examiner* — Mohammad Mayy
(74) *Attorney, Agent, or Firm* — Banner & Witcoff, Ltd.

(57) ABSTRACT

Methods and vapor deposition assemblies of selectively depositing material comprising silicon and oxygen on a first surface of a substrate relative to a second surface of the substrate by a cyclic deposition process are disclosed. The methods comprise providing a substrate into a reaction chamber, providing a metal or metalloid catalyst into the reaction chamber in a vapor phase, providing a silicon precursor comprising an alkoxy silane compound into the reaction chamber in a vapor phase and providing a plasma into the reaction chamber to form a reactive species for forming a material comprising silicon and oxygen on the
(Continued)

first surface. The methods may comprise subcycles for, for example, adjusting the proportions of material components.

22 Claims, 4 Drawing Sheets

(51) Int. Cl.
  *C23C 16/455* (2006.01)
  *H01J 37/32* (2006.01)

(56) References Cited

U.S. PATENT DOCUMENTS

| | | | |
|---|---|---|---|
| 9,679,808 B2 | 6/2017 | Haukka et al. | |
| 9,895,715 B2 | 2/2018 | Haukka et al. | |
| 10,049,924 B2 | 8/2018 | Haukka et al. | |
| 10,177,025 B2 | 1/2019 | Pore | |
| 10,343,186 B2 | 7/2019 | Pore et al. | |
| 10,358,719 B2 | 7/2019 | Yu | |
| 10,373,820 B2 | 8/2019 | Tois et al. | |
| 10,453,701 B2 | 10/2019 | Tois et al. | |
| 10,456,808 B2 | 10/2019 | Haukka et al. | |
| 10,695,794 B2 | 6/2020 | Pore et al. | |
| 10,814,349 B2 | 10/2020 | Pore et al. | |
| 10,854,460 B2 | 12/2020 | Tois et al. | |
| 10,923,361 B2 | 2/2021 | Tois et al. | |
| 10,991,573 B2 | 4/2021 | Jia et al. | |
| 11,081,342 B2 | 8/2021 | Farm et al. | |
| 11,094,535 B2 | 8/2021 | Tois et al. | |
| 11,145,506 B2 | 10/2021 | Maes et al. | |
| 11,213,853 B2 | 1/2022 | Haukka et al. | |
| 11,387,107 B2 | 7/2022 | Tois et al. | |
| 11,389,824 B2 | 7/2022 | Pore et al. | |
| 11,450,529 B2 | 9/2022 | Longrie et al. | |
| 11,694,903 B2 | 7/2023 | Ritala et al. | |
| 2011/0159673 A1* | 6/2011 | Hanawa | C23C 16/56 257/E21.135 |
| 2012/0325087 A1* | 12/2012 | Tsai | B01D 71/02232 95/56 |
| 2013/0330936 A1* | 12/2013 | Lachaud | H01L 21/022 438/787 |
| 2015/0380302 A1* | 12/2015 | Mountsier | H01L 21/31116 438/654 |
| 2016/0322213 A1* | 11/2016 | Thompson | H01L 21/0228 |
| 2018/0033679 A1 | 2/2018 | Pore | |
| 2018/0151345 A1* | 5/2018 | Haukka | H01L 21/02181 |
| 2018/0350587 A1* | 12/2018 | Jia | H01L 21/02205 |
| 2019/0172701 A1 | 6/2019 | Jia et al. | |
| 2020/0066512 A1* | 2/2020 | Tois | H01L 21/02219 |
| 2020/0105515 A1 | 4/2020 | Maes et al. | |
| 2020/0234943 A1* | 7/2020 | Bhuyan | H01L 21/02219 |
| 2020/0324316 A1 | 10/2020 | Pore et al. | |
| 2021/0043448 A1* | 2/2021 | Li | H01L 21/0228 |
| 2021/0115559 A1 | 4/2021 | Sharma et al. | |
| 2021/0175092 A1 | 6/2021 | Tois et al. | |
| 2021/0301391 A1 | 9/2021 | Givens et al. | |
| 2021/0351031 A1 | 11/2021 | Farm et al. | |
| 2021/0358739 A1 | 11/2021 | Tois et al. | |
| 2021/0358745 A1 | 11/2021 | Maes et al. | |
| 2022/0068634 A1 | 3/2022 | Deng et al. | |
| 2022/0084817 A1 | 3/2022 | Sharma et al. | |
| 2022/0181163 A1 | 6/2022 | Illiberi et al. | |
| 2022/0193720 A1 | 6/2022 | Haukka et al. | |
| 2022/0208542 A1 | 6/2022 | Maes et al. | |
| 2022/0367185 A1 | 11/2022 | Longrie et al. | |
| 2023/0178371 A1 | 6/2023 | Deng et al. | |
| 2023/0227965 A1 | 7/2023 | Deng et al. | |

OTHER PUBLICATIONS

"Electrical Properties of Aluminum Silicate Films Grown by Plasma Enhanced Atomic Layer Deposition", Jung Wook Lim, Sun Jin Yun, and Jin Ho Lee, Electrochemical and Solid-State Letters, 9 (1) F8-F11, (Year: 2009).*

* cited by examiner

SELECTIVE DEPOSITION OF MATERIAL COMPRISING SILICON AND OXYGEN USING PLASMA

FIELD

The present disclosure relates to methods and apparatuses for the manufacture of semiconductor devices. More particularly, the disclosure relates to methods and apparatuses for selectively depositing material comprising silicon and oxygen on a substrate, and layers comprising silicon and oxygen.

BACKGROUND

Semiconductor device fabrication processes generally use advanced deposition methods. Patterning is conventionally used in depositing different materials on semiconductor substrates. Selective deposition, which is receiving increasing interest among semiconductor manufacturers, could enable a decrease in steps needed for conventional patterning, reducing the cost of processing. Selective deposition could also allow enhanced scaling in narrow structures. Various alternatives for bringing about selective deposition have been proposed, and additional improvements are needed to expand the use of selective deposition in industrial-scale device manufacturing.

Silicon oxide, sometimes containing additional elements and/or silicates is used in many different applications, and it is one of the most widely used materials in semiconductor industry. Therefore, improvements in the selective deposition of silicon oxide-based materials are highly sought after and may have a large impact in making semiconductor device manufacturing faster and more cost-effective. Plasma-enhanced deposition processes may be used to deposit high-quality semiconductor materials and they are often fast compared to thermal processes. However, the use of plasma in selective deposition has proven to be challenging as plasma easily damages passivation layers used to guide the process selectivity, leading to loss of selectivity. For deposition of silicon oxide-based materials, the problem is pronounced, as silicon precursors typically need strong oxidizers to react for forming silicon oxide. This in turn may affect the structural and/pr chemical integrity of surrounding structures, oxidize any underlying surfaces (especially metal surfaces).

Any discussion, including discussion of problems and solutions, set forth in this section has been included in this disclosure solely for the purpose of providing a context for the present disclosure. Such discussion should not be taken as an admission that any or all of the information was known at the time the invention was made or otherwise constitutes prior art.

SUMMARY

This summary may introduce a selection of concepts in a simplified form, which may be described in further detail below. This summary is not intended to necessarily identify key features or essential features of the claimed subject matter, nor is it intended to be used to limit the scope of the claimed subject matter.

Various embodiments of the present disclosure relate to methods of depositing material comprising silicon and oxygen on a surface of substrate relative to another, chemically different, surface of the same substrate. Embodiments of the present disclosure further relate to vapor deposition assemblies for depositing material comprising silicon and oxygen on a surface of a substrate relative to another, chemically different, surface of the same substrate.

In an aspect, a method of selectively depositing material comprising silicon and oxygen on a first surface of a substrate relative to a second surface of the substrate by a cyclic deposition process is disclosed. The method comprises providing a substrate into a reaction chamber, providing a metal or metalloid catalyst into the reaction chamber in a vapor phase, providing a silicon precursor comprising an alkoxy silane compound into the reaction chamber in a vapor phase and providing a plasma into the reaction chamber to form a reactive species for forming a material comprising silicon and oxygen on the first surface.

In some embodiments, the first surface is a dielectric surface. In some embodiments, the dielectric surface comprises silicon.

In some embodiments, the second surface comprises a passivation layer. In some embodiments, the passivation layer comprises an organic polymer or a self-assembled monolayer (SAM).

In some embodiments, the metal or metalloid catalyst is a metal halide, organometallic compound or metalorganic compound. In some embodiments, the metal or metalloid catalyst is a metal catalyst. In some embodiments, the metal catalyst comprises trimethyl aluminum (TMA), dimethylaluminumchloride, aluminum trichloride ($AlCl_3$), dimethylaluminum isopropoxide (DMAI), tris(tertbutyl)aluminum (TTBA), tris(isopropoxide)aluminum (TIPA), tris(dimethylamino) aluminum (TDMAA) or triethyl aluminum (TEA). In some embodiments, the metal or metalloid catalyst is a metal or metalloid compound comprising B, Zn, Mg, Mn, La, Hf, Y, Al, Zr, Ti, Sn, Y or Ga. In some embodiments, the metal or metalloid catalyst is a metalloid catalyst. In some embodiments, the catalyst comprises an alkylborane. In some embodiments, the catalyst comprises a trialkylborane. In some embodiments, the catalyst comprises a trimethylborane or a triethylborane.

In some embodiments, the substrate is heated before providing the metal or metalloid catalyst into the reaction chamber.

In some embodiments, the alkoxy silane is selected from a group consisting of tetraacetoxysilane, tetramethoxysilane, tetraethoxysilane, trimethoxysilane, triethoxysilane and trimethoxy(3-methoxypropyl)silane.

In some embodiments, the plasma is generated from a noble gas. In some embodiments, the noble gas is selected from a group consisting of helium, neon and argon. In some embodiments, the plasma is additionally generated from an additional element. In some embodiments, the additional element is selected from hydrogen and nitrogen. In some embodiments, the additional element is nitrogen, and the material comprising silicon and oxygen further comprises nitrogen. In embodiments, according to the current disclosure, the deposited material may comprise predominantly silicon and oxygen, even if nitrogen is present in the material.

In some embodiments, the plasma is RF plasma, and the plasma power does not exceed 100 W. In some embodiments, plasma ion energy does not exceed 160 eV.

In some embodiments, the process comprises a first oxygen reactant into the reaction chamber in a vapor phase after providing a metal or metalloid catalyst into the reaction chamber.

In some embodiments, the process comprises providing a second oxygen reactant into the reaction chamber in a vapor phase at least partially simultaneously with providing the silicon precursor into the reaction chamber.

In some embodiments, the selectivity of deposition of material comprising silicon and oxygen on the first surface relative to the second surface is greater than about 50%.

In some embodiments, a pressure during a deposition cycle is lower than about 20 Torr. In some embodiments, a pressure during a deposition cycle is lower than about 10 Torr. In some embodiments, a pressure during a deposition cycle is higher than about 5 Torr. In some embodiments, a pressure during a deposition cycle is lower than about 10 Torr. In some embodiments, a pressure during a deposition cycle is between about 3 Torr and about 25 Torr. In some embodiments, a pressure during a deposition cycle is between about 2 Torr and about 10 Torr. In some embodiments, a pressure during a deposition cycle is between about 2 Torr and about 8 Torr.

In some embodiments, the method further comprises an activation treatment before deposition of the material comprising silicon and oxygen, wherein the activation treatment comprises providing a metal or metalloid catalyst to the reaction chamber in a vapor phase and providing a first oxygen reactant into the reaction chamber in a vapor phase. In some embodiments of the activation treatment, the metal or metalloid catalyst and the first oxygen reactant are provided into the reaction chamber cyclically.

In some embodiments, the material comprising silicon and oxygen comprises silicon oxide, aluminum silicate and/or silicon oxycarbide.

In another aspect, a method of selectively depositing material comprising silicon and oxygen on a first surface of a substrate relative to a second surface of the substrate by a cyclic deposition process is disclosed. The method comprises providing a substrate into a reaction chamber, providing a metal or metalloid catalyst to the reaction chamber in a vapor phase, and performing a silicon and oxygen subcycle, said subcycle comprising alternately and sequentially providing a silicon precursor comprising an alkoxy silane compound into the reaction chamber in a vapor phase and providing a plasma into the reaction chamber to form a reactive species for forming material comprising silicon and oxygen on the first surface.

In some embodiments, the process comprises providing a passivation agent into the reaction chamber in a vapor phase to selectively passivate the second surface before providing a metal or metalloid catalyst into the reaction chamber.

In some embodiments, the silicon and oxygen subcycle is repeated two or more times. In some embodiments, providing a metal or metalloid catalyst into the reaction chamber and the silicon and oxygen subcycle are repeated two or more times.

In another aspect, a method of selectively depositing material comprising silicon and oxygen on a first surface of a substrate relative to a second surface of the substrate by a cyclic deposition process is disclosed. The method comprises providing a substrate into a reaction chamber, performing a metal oxide subcycle, said subcycle comprising providing alternately and sequentially a metal or metalloid catalyst and a first oxygen reactant comprising oxygen and hydrogen into the reaction chamber in a vapor phase and performing a silicon and oxygen subcycle, said subcycle comprising alternately and sequentially providing a silicon precursor comprising an alkoxy silane compound into the reaction chamber in a vapor phase and providing a plasma into the reaction chamber to form a reactive species for forming material comprising silicon and oxygen on the first surface.

In some embodiments, at least one of the metal oxide subcycle and the silicon and oxygen subcycle are performed more than once before performing the other subcycle.

In yet another aspect, a vapor deposition assembly for selectively depositing material comprising silicon and oxygen on a first surface of a substrate relative to a second surface of the substrate is disclosed. The vapor deposition assembly comprises one or more reaction chambers constructed and arranged to hold the substrate, a precursor injector system constructed and arranged to provide a metal or metalloid catalyst, a silicon precursor and a plasma into the reaction chamber in a vapor phase. The vapor deposition assembly also comprises a first reactant vessel constructed and arranged to contain the metal or metalloid catalyst, a second reactant vessel constructed and arranged to contain the silicon precursor and a third reactant vessel constructed and arranged to contain the plasma precursor. The vapor deposition assembly is constructed and arranged to provide the metal or metalloid catalyst and the silicon precursor via the precursor injector system to the reaction chamber, and to generate plasma from the plasma precursor in the reaction chamber for selectively depositing material comprising silicon and oxygen on the first surface of the substrate.

In this disclosure, any two numbers of a variable can constitute a workable range of the variable, and any ranges indicated may include or exclude the endpoints. Additionally, any values of variables indicated (regardless of whether they are indicated with "about" or not) may refer to precise values or approximate values and include equivalents, and may refer to average, median, representative, majority, or the like. Further, in this disclosure, the terms "including," "constituted by" and "having" refer independently to "typically or broadly comprising," "comprising," "consisting essentially of," or "consisting of" in some embodiments. In this disclosure, any defined meanings do not necessarily exclude ordinary and customary meanings in some embodiments.

BRIEF DESCRIPTION OF DRAWINGS

The accompanying drawings, which are included to provide a further understanding of the disclosure and constitute a part of this specification, illustrate exemplary embodiments, and together with the description help to explain the principles of the disclosure. In the drawings

DETAILED DESCRIPTION

Figure 1:
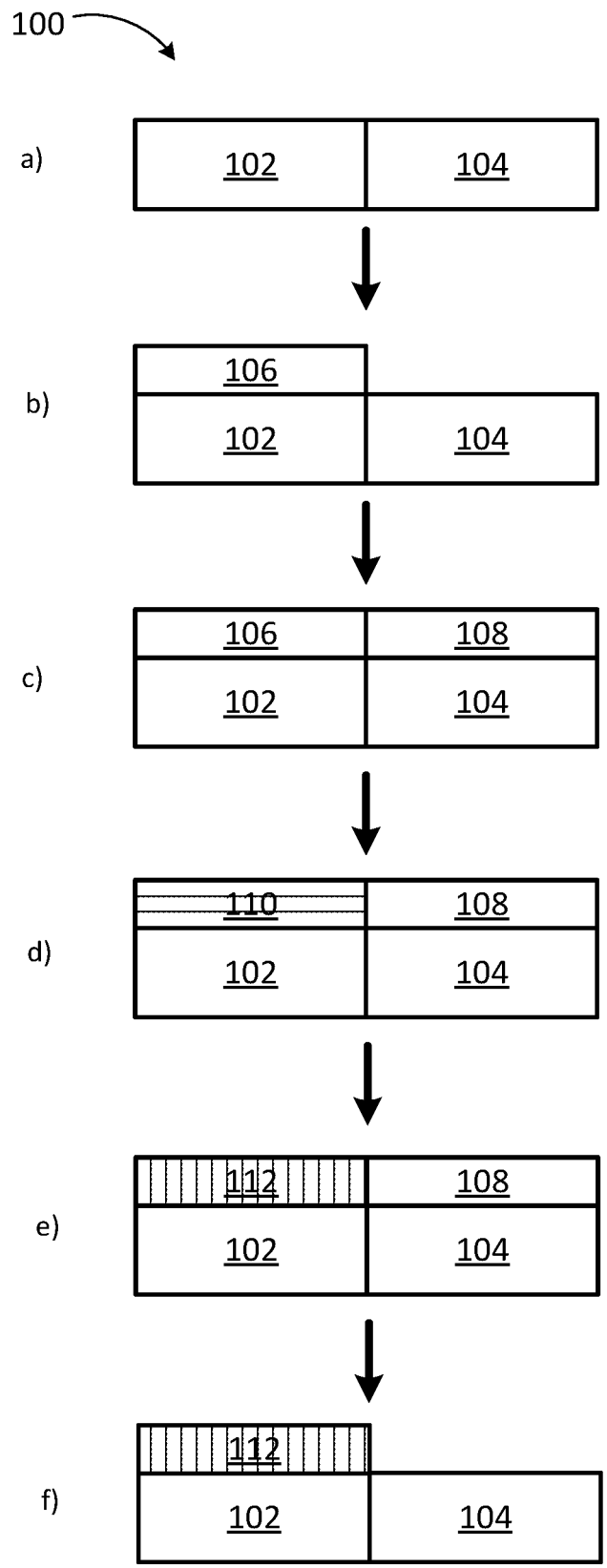
FIG. 1 is a schematic presentation of selective deposition according to the current disclosure.

The description of exemplary embodiments of methods and deposition assemblies provided below is merely exemplary and is intended for purposes of illustration only. The following description is not intended to limit the scope of the disclosure or the claims. Moreover, recitation of multiple embodiments having indicated features is not intended to exclude other embodiments having additional features or other embodiments incorporating different combinations of the stated features. For example, various embodiments are set forth as exemplary embodiments and may be recited in the dependent claims. Unless otherwise noted, the exemplary embodiments or components thereof may be combined or may be applied separate from each other. The headings provided herein, if any, are for convenience only and do not necessarily affect the scope or meaning of the claimed invention.

The material comprising silicon and oxygen and layers formed by the methods described herein can be used in a variety of applications in the semiconductor industry. Exemplary embodiments of the disclosure can be used to manufacture electronic devices, such as memory and/or logic circuits. More specifically, the embodiments of the current disclosure may be used to manufacture layers comprising silicon and oxygen that can be used, for example, in a wide variety of semiconductor devices, including MOS-FET, memory capacitors, gapfill, as well as in back-end interconnects as inter-layer dielectrics to enable fully-aligned vias.

Material comprising silicon and oxygen, such as layers comprising silicon oxide or metal silicate, can be deposited selectively on specific surfaces relative to other surfaces on a substrate by the methods described herein. The two surfaces are chemically distinct to provide contrast for selective deposition.

In an aspect, a method of selectively depositing material comprising silicon and oxygen on a first surface of a substrate relative to a second surface of the substrate by a cyclic deposition process is disclosed. The method comprises providing a substrate into a reaction chamber, providing a metal or metalloid catalyst (abbreviated as "catalyst" in the current disclosure) into the reaction chamber in a vapor phase, providing a silicon precursor comprising an alkoxy silane compound into the reaction chamber in a vapor phase and providing a plasma into the reaction chamber to form a reactive species for forming a material comprising silicon and oxygen on the first surface. In some embodiments, the material comprising silicon and oxygen comprises substantially only silicon oxide. In some embodiments, the material comprising silicon and oxygen comprises substantially only silicon dioxide. In some embodiments, the material comprising silicon and oxygen comprises a metal silicate. In some embodiments, the material comprising silicon and oxygen comprises silicon oxide and a metal silicate.

Substrate

As used herein, the term "substrate" may refer to any underlying material or materials that may be used to form, or upon which, a device, a circuit, material or a material layer may be formed. A substrate can include a bulk material, such as silicon (such as single-crystal silicon), other Group IV materials, such as germanium, or other semiconductor materials, such as a Group II-VI or Group III-V semiconductor materials. A substrate can include one or more layers overlying the bulk material. The substrate can include various topologies, such as gaps, including recesses, lines, trenches or spaces between elevated portions, such as fins, and the like formed within or on at least a portion of a layer of the substrate. Substrate may include nitrides, for example TiN, oxides, insulating materials, dielectric materials, conductive materials, metals, such as such as tungsten, ruthenium, molybdenum, cobalt, aluminum or copper, or metallic materials, crystalline materials, epitaxial, heteroepitaxial, and/or single crystal materials. In some embodiments of the current disclosure, the substrate comprises silicon. The substrate may comprise other materials, as described above, in addition to silicon. The other materials may form layers. A substate according to the current disclosure comprises two surfaces having different material properties.

First Surface and Second Surface

According to some aspects of the present disclosure, selective deposition can be used to deposit a material comprising silicon and oxygen on a first surface relative to a second surface of the substrate. The two surfaces have different material properties, i.e. they are chemically distinct.

In some embodiments, the first surface is a dielectric surface. In some embodiments the dielectric material comprises a low k material. In some embodiments, the first surface is a low-k surface. In some embodiments, the first surface comprises an oxide. In some embodiments, the first surface comprises a nitride. In some embodiments, the first surface comprises silicon. Examples of silicon-comprising dielectric materials include silicon oxide—based materials, including grown or deposited silicon dioxide, doped and/or porous oxides and native oxide on silicon. In some embodiments, the first surface comprises silicon oxide. In some embodiments, the first surface is a silicon oxide surface, such as a native oxide surface, a thermal oxide surface or a chemical oxide surface. In some embodiments, the first surface comprises hydroxyl (—OH) groups. In some embodiments, the first surface may additionally comprise hydrogen (—H) terminations, such as an HF dipped Si or HF dipped Ge surface. In such embodiments, the surface of interest will be considered to comprise both the —H terminations and the material beneath the —H terminations. In some embodiments, the first surface comprises carbon. In some embodiments, the first surface comprises, consists essentially of, or consists of SiN. In some embodiments, the first surface comprises, consists essentially of, or consists of SiOC. In some embodiments, the first surface is an etch-stop layer. An etch-stop layer may comprise, for example a nitride.

In some embodiments the dielectric material comprises a metal oxide. Thus, in some embodiments, a material comprising silicon and oxygen is selectively deposited on a first metal oxide surface relative to a second surface. In some embodiments, the first surface comprises aluminum oxide. In some embodiments, the first surface is a high-k surface, such as hafnium oxide-comprising surface, a lanthanum oxide-comprising surface. In some embodiments, a material comprising silicon and oxygen is selectively deposited on a first surface comprising a metal oxide relative to another surface. A metal oxide surface may be, for example a tungsten oxide (WOx) surface, hafnium oxide (HfOx) surface, titanium oxide (TiOx) surface, aluminum oxide (AlOx) surface or zirconium oxide (ZrOx) surface. In some embodiments, a metal oxide surface is an oxidized surface of a metallic material. In some embodiments, a metal oxide surface is created by oxidizing at least the surface of a metallic material using an oxygen compound, such as compounds comprising $O_3$, $H_2O$, $H_2O_2$, $O_2$, oxygen atoms, plasma or radicals or mixtures thereof. In some embodiments, a metal oxide surface is a native oxide formed on a metallic material.

In some embodiments, a material comprising silicon and oxygen, such as silicon oxide, metal silicate or a combination thereof, is selectively deposited on a first dielectric surface of a substrate relative to a second conductive (e.g., metal or metallic) surface of the substrate. In some embodiments the dielectric surface and metal or metallic surface are adjacent to each other.

In some embodiments, a material comprising silicon and oxygen such as silicon oxide, metal silicate or a combination thereof, is selectively deposited on a first dielectric surface of a substrate relative to a second, different dielectric surface. In some such embodiments, the dielectric surfaces have different compositions (e.g., silicon, silicon nitride, carbon, silicon oxide, silicon oxynitride, germanium oxide). In some embodiments, a passivation blocking agents, such as silylation, is used to improve contrast between two dielectric surfaces before depositing a passivation layer on the first surface. In some embodiments, a material comprising silicon and oxygen is selectively deposited on a first $SiO_2$ surface relative to a second, different, dielectric surface. In some embodiments, a material comprising silicon and oxygen is selectively deposited on a first Si or Ge surface relative to a second, different, dielectric surface, for example an HF-dipped Si or HF-dipped Ge surface.

The term dielectric is used in the description herein for the sake of simplicity in distinguishing from the other surface, namely the metal or metallic surface. It will be understood by those skilled in the art that not all non-conducting surfaces are dielectric surfaces. For example, the metal or metallic surface may comprise an oxidized metal surface that is electrically non-conducting or has a very high resistivity. Selective deposition processes taught herein can deposit on dielectric surfaces with minimal deposition on such adjacent non-conductive metal or metallic surfaces.

For embodiments in which one surface of the substrate comprises a metal, the surface is referred to as a metal surface. In some embodiments, a metal surface consists essentially of, or consists of one or more metals. A metal surface may be a metal surface or a metallic surface. In some embodiments the metal or metallic surface may comprise metal, metal oxides, and/or mixtures thereof. In some embodiments the metal or metallic surface may comprise surface oxidation. In some embodiments the metal or metallic material of the metal or metallic surface is electrically conductive with or without surface oxidation. In some embodiments, metal or a metallic surface comprises one or more transition metals. In some embodiments, the metal or metallic surface comprises one or more transition metals from row 4 of the periodic table of elements. In some embodiments, the metal or metallic surface comprises one or more transition metals from groups 4 to 11 of the periodic table of elements. In some embodiments, a metal or metallic surface comprises aluminum (Al). In some embodiments, a metal or metallic surface comprises copper (Cu). In some embodiments, a metal or metallic surface comprises tungsten (W). In some embodiments, a metal or metallic surface comprises cobalt (Co). In some embodiments, a metal or metallic surface comprises nickel (Ni). In some embodiments, a metal or metallic surface comprises niobium (Nb). In some embodiments, the metal or metallic surface comprises iron (Fe). In some embodiments, the metal or metallic surface comprises molybdenum (Mo). In some embodiments, a metal or metallic surface comprises a metal selected from a group consisting of Al, Mn, Fe, Co, Ni, Cu, Zn, Nb, Mo, Ru and W. In some embodiments, the metal or metallic surface comprises a transition metal selected from a group consisting of Zn, Fe, Mn and Mo.

In some embodiments, a metallic surface comprises titanium nitride. In some embodiments, the metal or metallic surface comprises one or more noble metals, such as Ru. In some embodiments, the metal or metallic surface comprises a conductive metal oxide. In some embodiments, the metal or metallic surface comprises a conductive metal nitride. In some embodiments, the metal or metallic surface comprises a conductive metal carbide. In some embodiments, the metal or metallic surface comprises a conductive metal boride. In some embodiments, the metal or metallic surface comprises a combination conductive materials. For example, the metal or metallic surface may comprise one or more of ruthenium oxide (RuOx), niobium carbide (NbCx), niobium boride (NbBx), nickel oxide (NiOx), cobalt oxide (CoOx), niobium oxide (NbOx), tungsten carbonitride (WNCx), tantalum nitride (TaN), or titanium nitride (TiN).

In some embodiments, the second surface may comprise a passivated metal surface, for example a passivated Cu surface. That is, in some embodiments, the second surface may comprise a metal surface comprising a passivation agent, for example an organic passivation layer such as a polyimide passivation layer or a self-assembled monolayer. In some embodiments, the passivation layer remains on the second surface over at least two, such as at least about 10, about 20, about 50, about 100 or about 150 deposition cycles of the material comprising silicon and oxygen. In other words, a passivation layer, such as polyimide-comprising layer, is used that is able to withstand the deposition conditions over an extended period of time.

In some embodiments, a material comprising silicon and oxygen is selectively deposited on a first dielectric surface of a substrate relative to a second metal or metallic surface of the substrate. In some embodiments, the second surface comprises a metal oxide, elemental metal, or metallic surface. In some embodiments, the second metal or metallic surface comprises a passivation layer comprising polyamic acid, polyimide, or other polymeric material.

In some embodiments, a substrate is provided comprising a first dielectric surface and a second metal or metallic surface. In some embodiments, a substrate is provided that comprises a first metal oxide surface. In some embodiments, the first surface may comprise —OH groups. In some embodiments, the first surface may be a $SiO_2$-based surface. In some embodiments, the first surface may comprise Si—O bonds. In some embodiments, the first surface may comprise a $SiO_2$-based low-k material. In some embodiments, the first surface may comprise more than about 30%, or more than about 50% of $SiO_2$. In some embodiments the first surface may comprise a silicon dioxide surface In some embodiments, the first surface may comprise $GeO_2$. In some embodiments, the first surface may comprise Ge—O bonds. In some embodiments, a material comprising silicon and oxygen is selectively deposited on a first Si or Ge surface, for example an HF-dipped Si or HF-dipped Ge surface, relative to a second metal or metallic surface. For example, in some embodiments, the first surface may comprise a naturally or chemically grown silicon dioxide surface. In some embodiments, the first surface may comprise a thermally grown silicon dioxide surface.

In some embodiments, the substrate may be pretreated or cleaned prior to or at the beginning of the selective deposition process. In some embodiments, the substrate may be subjected to a plasma cleaning process at prior to or at the beginning of the selective deposition process. In some embodiments, a plasma cleaning process may not include ion bombardment, or may include relatively small amounts of ion bombardment. For example, in some embodiments, the substrate surface may be exposed to plasma, radicals, excited species, and/or atomic species prior to or at the beginning of the selective deposition process. In some embodiments, the substrate surface may be exposed to hydrogen plasma, radicals, or atomic species prior to or at the beginning of the selective deposition process. In some embodiments, a pretreatment or cleaning process may be carried out in the same reaction chamber as a selective deposition process. However, in some embodiments, a pretreatment or cleaning process may be carried out in a separate reaction chamber.

Surface Pretreatments

In some embodiments, a dielectric first surface may be selectively blocked relative to another surface, for example by selectively silylating the dielectric surface. In some embodiments, the dielectric surface is blocked by exposure to a silylation agent, such as allyltrimethylsilane (TMS-A), chlorotrimethylsilane (TMS-Cl), N-(trimethylsilyl)imidazole (TMS-Im), octadecyltrichlorosilane (ODTCS), hexamethyldisilazane (HMDS), or N-(trimethylsilyl)dimethylamine (TMSDMA). In some embodiments, the dielectric blocking step may be omitted. In some embodiments, the blocking may aid in subsequent selective passivation of a metal surface, as described below. Thus, blocking a dielectric surface may, in some embodiments, allow the selective passivation of another surface, such as a metal surface or a dielectric surface of different composition. In some embodiments, the blocked dielectric surface may be treated, such as with a plasma, to provide the desired surface terminations to facilitate catalyst chemisorption, as described in more detail below. A second surface, such as a metal surface, is passivated, for example by selectively forming an organic polymer layer on the second surface. In some embodiments, the silylation of the dielectric surface aids in the selectivity of the formation of the polymer passivation layer on a second surface. In some embodiments, blocking, such as silylation, does not require a specific removal step before depositing material comprising silicon and oxygen on the first surface.

Subsequently, a catalyst is selectively deposited on the first dielectric surface relative to the second surface. In some embodiments, the catalyst is selectively chemisorbed on the dielectric surface. The catalyst may be, for example, a metal catalyst as described below.

Material comprising silicon and oxygen is then selectively deposited on the first surface relative to the passivated second surface by providing a silicon precursor into the reaction chamber. The catalyst according to the current disclosure may improve the interaction between the substrate and the silicon precursor leading to catalytic growth of material comprising silicon and oxygen selectively on the dielectric first surface of the substrate relative to the second surface (such as a passivated metal or metal oxide surface). The material comprising silicon and oxygen may be deposited by a cyclical vapor deposition process in which the substrate is alternately contacted with the catalyst and the silicon precursor until a material comprising silicon and oxygen of a desired thickness has been selectively deposited. In some embodiments, the material comprising silicon and oxygen is deposited by an ALD process. In some embodiments, the ALD process is a plasma-enhanced ALD process. Following deposition of material comprising silicon and oxygen, the passivation layer on the second surface may be removed, such as by etching. Etching may be performed, for example, by a plasma or a chemical treatment.

In some embodiments, a first dielectric surface, such as an oxide surface, on a substrate is blocked by silylation with a silylating agent such as allyltrimethylsilane (TMS-A), chlorotrimethylsilane (TMS-Cl), N-(trimethylsilyl)imidazole (TMS-Im), octadecyltrichlorosilane (ODTCS), hexamethyldisilazane (HMDS), or N-(trimethylsilyl)dimethylamine (TMSDMA), an organic polymer is selectively deposited on a second surface of the same substrate, a metal catalyst such as an aluminum catalyst is selectively deposited on the dielectric surface of the same substrate, and material comprising silicon and oxygen is subsequently selectively deposited on the first surface of the substrate relative to the passivated second surface. For example, a layer comprising silicon and oxygen may be selectively deposited on a dielectric surface, such as a metal oxide surface, a silicon oxide surface or a low k surface, relative to an adjacent metal surface by, for example, blocking the first surface by silylation with a silylating agent, using a thiol SAM or polyimide layer to passivate the metal surface, using trimethyl aluminum (TMA), dimethylaluminumchloride, aluminum trichloride ($AlCl_3$), dimethylaluminum isopropoxide (DMAI), tris(tertbutyl)aluminum (TTBA), tris(isopropoxide)aluminum (TIPA), tris(dimethylamino) aluminum (TDMAA) or triethyl aluminum (TEA) as the catalyst, and a using an alkoxy silane as the silicon precursor. In some embodiments, the silylated dielectric surface is plasma-treated prior to providing the catalyst into the reaction chamber. The substrate may be contacted with a sufficient quantity of the blocking agent and for a sufficient period of time that the dielectric surface is selectively blocked with silicon species. In some embodiments, the dielectric surface is not passivated with a self-assembled monolayer (SAM).

In some embodiments, the process according to the current disclosure comprises providing a passivation agent into the reaction chamber in a vapor phase to selectively passivate the second surface before providing a catalyst into the reaction chamber. An organic polymer passivation layer may be selectively formed on the second (for example metal) surface relative to the first dielectric surface by providing a passivation agent into the reaction chamber. A passivation agent may be provided by a cyclic deposition process. For example, polyimide-comprising passivation layer may be deposited by providing an acetic anhydride and a diamine alternately and sequentially into a reaction chamber to form a passivation layer. The passivation layer may be selectively deposited on the second surface by providing a passivating agent into the reaction chamber. In some embodiments, the passivation layer on the metal or metallic surface inhibits, prevents or reduces the formation of the material comprising silicon and oxygen on the metal or metallic surface.

A plasma treatment may be used to activate the dielectric surface. For example, the silylated dielectric surface may be exposed to a $H_2$ plasma.

In embodiments of the current disclosure, a metal or metalloid catalyst is selectively provided on the first surface relative to the second surface, such as by providing a metal or metalloid catalyst into the reaction chamber. Therein, the catalyst contacts the substrate. The first surface may be a dielectric surface, and the second surface may be a metal surface. In some embodiments, the substrate is contacted with a catalyst as described below. The catalyst may be, for example, a compound comprising B, Zn, Mg, Mn, La, Hf, Al, Zr, Ti, Sn, Y or Ga. In some embodiments, the catalyst is a metal halide, organometallic or metalorganic compound. In some embodiments, the catalyst may be a metal oxide. In some embodiments, the catalyst is an aluminum catalyst comprising trimethyl aluminum (TMA), dimethylaluminumchloride, aluminum trichloride ($AlCl_3$), dimethylaluminum isopropoxide (DMAI), tris(tertbutyl)aluminum (TTBA), tris(isopropoxide)aluminum (TIPA) or triethyl aluminum (TEA). In some embodiments, the catalyst is a zirconium compound, such as bis(methylcyclopentadienyl) methoxymethyl zirconium (ZrD-04). In some embodiments, the catalyst is tetrakis(ethylmethylamino)zirconium (TEMAZ). In some embodiments, the catalyst is $ZrCl_4$. In some embodiments, the catalyst is a lanthanum compound, such as tris(isopropyl-cyclopentadienyl)lanthanum ($La(iPrCp)_3$). In some embodiments, the catalyst is a titanium compound, such as titanium isopropoxide (TTIP) or $TiCl_4$. In some embodiments, the catalyst is a gallium compound, such as trimethylgallium (TMG). In some embodiments, the catalyst is a hafnium compound, such as $HfCl_4$ or $Hf(NO_3)_4$.

In some embodiments, the catalyst may preferentially chemisorb on a dielectric surface, for example on a dielectric surface comprising a blocking agent, relative to a passivated metal surface. In some embodiments, the catalyst preferentially deposits on the dielectric surface relative to the passivated metal surface. In some embodiments, the passivating agent on the metal surface inhibits or prevents deposition of catalyst on the metal surface. In some embodiments, a single exposure to the passivating agent may prevent deposition of catalyst on the metal surface for 1, 2, 5, 10, 20, 30, 40 or 50 or more cycles in which the substrate is contacted with the catalyst. In some embodiments, the second surface is not passivated and the catalyst selectively chemisorbs on the dielectric surface in the absence of a passivating agent on the metal surface. For example, the catalyst may selectively deposit on a dielectric surface comprising a blocking agent relative to a second surface. In some embodiments, a catalyst is not utilized.

After contacting the catalyst with the dielectric surface, material comprising silicon and oxygen is selectively deposited on the dielectric surface relative to the passivated second surface. For example, the substrate may be exposed to a silicon precursor, such as an alkoxy silane. The silicon precursor and the reactive species generated from plasma (such as plasma generated from a noble gas) may react with the surface comprising the catalyst to form material comprising silicon and oxygen. For example, the substrate may be contacted with a silicon precursor comprising an alkoxy silane such that the alkoxy silane decomposes at the catalyst atoms on the dielectric surface and with the plasma-derived reactive species, resulting in the selective growth of material comprising silicon and oxygen on the dielectric surface relative to the second surface.

Material Comprising Silicon and Oxygen

Material comprising silicon and oxygen according to the current disclosure may comprise, consist essentially of, or consist of silicon oxide, such as silicon dioxide. However, in some embodiments, the material comprising silicon and oxygen comprises additional elements, such as aluminum (Al). In some embodiments, the material comprising silicon and oxygen comprises, consists substantially of, or consists of metal silicate, such as aluminum silicate. The methods according to the current disclosure allow for the deposition of materials comprising silicon, oxygen and a metal, such that the amount of the metal is adjustable. Alternating two or more different deposition processes, at least one of which is a method according to the current disclosure, nanolaminate structure of alternating composition may be deposited. In some embodiments, the two or more different deposition methods are all methods according to the current disclosure.

In some embodiments, a layer comprising silicon and oxygen is deposited. As used herein, the term "layer" and/or "film" can refer to any continuous or non-continuous structure and material, such as material deposited by the methods disclosed herein. For example, layer and/or film can include two-dimensional materials, three-dimensional materials, nanoparticles or even partial or full molecular layers or partial or full atomic layers or clusters of atoms and/or molecules. A film or layer may comprise material or a layer with pinholes, which may be at least partially continuous. A seed layer may be a non-continuous layer serving to increase the rate of nucleation of another material. However, the seed layer may also be substantially or completely continuous.

A silicon and oxygen-comprising layer of desired thickness may be deposited by a cyclic deposition process according to the current disclosure. In some embodiments, the layer comprising silicon and oxygen is substantially continuous. In some embodiments, the layer comprising silicon and oxygen is continuous. In some embodiments, the layer comprising silicon and oxygen has an approximate thickness of at least about 0.5 nm. In some embodiments, the layer comprising silicon and oxygen has an approximate thickness of at least about 1 nm. In some embodiments, the layer comprising silicon and oxygen has an approximate thickness of at least about 5 nm. In some embodiments, the layer comprising silicon and oxygen has an approximate thickness of at least about 10 nm. In some embodiments, the layer comprising silicon and oxygen has an approximate thickness of about 1 nm to about 50 nm. In some embodiments, substantially or completely continuous layer comprising silicon and oxygens having a thickness of less than about 10 nm, such as from about 4 nm to about 9 nm, for example about 5 nm or about 6 nm may be selectively deposited on the first surface of the substrate.

In some embodiments, the silicon to metal ratio of material comprising silicon and oxygen is equal to or larger than about 3. In some embodiments, the silicon to metal ratio of material comprising silicon and oxygen is equal to or larger than about 4. In some embodiments, the silicon to metal ratio of material comprising silicon and oxygen is equal to or larger than about 5, such as about 6. In some embodiments, the silicon-to-metal ratio of material comprising silicon and oxygen is from about 2.5 to about 6, such as from about 3 to about 5.

In some embodiments, the k value of material comprising silicon and oxygen deposited according to the current disclosure is below about 5, or below about 4.

In some embodiments, the wet etch resistance of material comprising silicon and oxygen according to the current disclosure is from about 0.1 to about 1 nm/s, as measured by exposure to 0.5% HF, and depending on the composition of the material comprising silicon and oxygen. In some embodiments, the wet etch resistance rate is about 0.2 nm/s as measured by exposure to 0.5% HF.

General Process

In the methods according to the current disclosure, a substrate comprising a first surface and a second surface is provided into a reaction chamber, a catalyst is provided into the reaction chamber in a vapor phase, silicon precursor comprising an alkoxy silane compound is provided into the reaction chamber in a vapor phase and a plasma is provided into the reaction chamber to form a reactive species for forming a material comprising silicon and oxygen on the first surface.

The terms "precursor" and "reactant" can refer to molecules (compounds or molecules comprising a single element) that participate in a chemical reaction that produces another compound. A precursor typically contains portions that are at least partly incorporated into the compound or element resulting from the chemical reaction in question. Such a resulting compound or element may be deposited on a substrate. A reactant may me an element or a compound that is not incorporated into the resulting compound or element to a significant extent. However, a reactant may also contribute to the resulting compound or element in certain embodiments.

In some embodiments, a precursor is provided in a mixture of two or more compounds. In a mixture, the other compounds in addition to the precursor may be inert compounds or elements. In some embodiments, a precursor is provided in a composition. In some embodiments, a precursor is substantially or completely formed of a single compound. Composition may be a solution or a gas in standard conditions.

The current disclosure relates to a selective deposition process. Selectivity can be given as a percentage calculated by [(deposition on first surface)−(deposition on second surface)]/(deposition on the first surface). Deposition can be measured in any of a variety of ways. In some embodiments, deposition may be given as the measured thickness of the deposited material. In some embodiments, deposition may be given as the measured amount of material deposited.

In some embodiments, selectivity is greater than about 30%. In some embodiments, selectivity is greater than about 50%. In some embodiments, selectivity is greater than about 75% or greater than about 85%. In some embodiments, selectivity is greater than about 90% or greater than about 93%. In some embodiments, selectivity is greater than about 95% or greater than about 98%. In some embodiments, selectivity is greater than about 99% or even greater than about 99.5%. In embodiments, the selectivity can change over the duration or thickness of a deposition.

In some embodiments, deposition only occurs on the first surface and does not occur on the second surface. In some embodiments, deposition on the first surface of the substrate relative to the second surface of the substrate is at least about 80% selective, which may be selective enough for some applications. In some embodiments the deposition on the first surface of the substrate relative to the second surface of the substrate is at least about 50% selective, which may be selective enough for some particular applications. In some embodiments the deposition on the first surface of the substrate relative to the second surface of the substrate is at least about 10% selective, which may be selective enough for some particular applications.

Cyclic Deposition Process

In some embodiments, cyclic vapor deposition methods are used to deposit material comprising silicon and oxygen. In some embodiments, cyclic vapor deposition is used, for example, cyclic CVD or atomic layer deposition (ALD) processes are used. After selective deposition of the material comprising silicon and oxygen is completed, further processing can be carried out to form the desired structures.

In the current disclosure, the deposition process may comprise a cyclic deposition process, such as an atomic layer deposition (ALD) process or a cyclic chemical vapor deposition (VCD) process. The term "cyclic deposition process" can refer to the sequential introduction of precursor(s) and/or reactant(s) into a reaction chamber to deposit material, such as material comprising silicon and oxygen, on a substrate. Cyclic deposition includes processing techniques such as atomic layer deposition (ALD), cyclic chemical vapor deposition (cyclic CVD), and hybrid cyclic deposition processes that include an ALD component and a cyclic CVD component. The process may comprise a purge step between providing precursors or between providing a precursor and a reactant in the reaction chamber. In cyclic deposition processes, the substrate and/or reaction space can be heated to promote the reaction between the gaseous precursor and/or reactants. In some embodiments the precursor(s) and reactant(s) are provided until a layer having a desired thickness is deposited.

The process may comprise one or more cyclic phases. For example, pulsing of silicon precursor and plasma may be repeated. In some embodiments, the process comprises or one or more acyclic phases. In some embodiments, the deposition process comprises the continuous flow of at least one precursor. In such an embodiment, the process comprises a continuous flow of a silicon precursor or a plasma. In some embodiments, one or more of the precursors and/or reactants are provided in the reaction chamber continuously. In some embodiments, catalyst may be provided in the reaction chamber continuously.

The term "atomic layer deposition" (ALD) can refer to a vapor deposition process in which deposition cycles, such as a plurality of consecutive deposition cycles, are conducted in a reaction chamber. The term atomic layer deposition, as used herein, is also meant to include processes designated by related terms, such as chemical vapor atomic layer deposition, when performed with alternating pulses of precursor(s)/reactant(s), and optional purge gas(es). Generally, for ALD processes, during each cycle, a precursor is introduced to a reaction chamber and is chemisorbed to a deposition surface (e.g., a substrate surface that may include a previously deposited material from a previous ALD cycle or other material), forming about a monolayer or sub-monolayer of material that does not readily react with additional precursor (i.e., a self-limiting reaction). Thereafter, in some cases, another precursor or a reactant may subsequently be introduced into the process chamber for use in converting the chemisorbed precursor to the desired material on the deposition surface. The second precursor or a reactant can be capable of further reaction with the precursor. Purging steps may be utilized during one or more cycles, e.g., during each step of each cycle, to remove any excess precursor from the process chamber and/or remove any excess reactant and/or reaction byproducts from the reaction chamber. Thus, in some embodiments, the cyclic deposition process comprises purging the reaction chamber after providing a precursor into the reaction chamber. In some embodiments, the cyclic deposition process comprises purging the reaction chamber after providing a silicon precursor into the reaction chamber. In some embodiments, the cyclic deposition process comprises purging the reaction chamber after providing plasma into the reaction chamber. In some embodiments, the cyclic deposition process comprises purging the reaction chamber after providing a silicon precursor into the reaction chamber, and after providing a plasma into the reaction chamber and providing a catalyst into the reaction chamber.

CVD type processes typically involve gas phase reactions between two or more precursors and/or reactants. The precursor(s) and reactant(s) can be provided simultaneously to the reaction space or substrate, or in partially or completely separated pulses. In some embodiments, cyclic CVD processes can be used with multiple cycles to deposit a thin film having a desired thickness. In cyclic CVD processes, the precursors and/or reactants may be provided to the reaction chamber in pulses that do not overlap, or that partially or completely overlap.

The reaction chamber can form part of an atomic layer deposition (ALD) assembly. The reaction chamber can form part of a chemical vapor deposition (CVD) assembly. The reactor may be a single wafer reactor. Alternatively, the reactor may be a batch reactor. The assembly may comprise one or more multi-station deposition chambers. Various phases of method can be performed within a single reaction chamber or they can be performed in multiple reaction chambers, such as reaction chambers of a cluster tool. In some embodiments, the method is performed in a single reaction chamber of a cluster tool, but other, preceding or subsequent, manufacturing steps of the structure or device are performed in additional reaction chambers of the same cluster tool. Optionally, an assembly including the reaction chamber can be provided with a heater to activate the reactions by elevating the temperature of one or more of the substrate and/or the reactants and/or precursors. The material comprising silicon and oxygen according to the current disclosure may be deposited in a cross-flow reaction chamber. The material comprising silicon and oxygen according to the current disclosure may be deposited in a showerhead-type reaction chamber.

In some embodiments, the catalyst, the silicon precursor and the plasma are all provided into the reaction chamber during one deposition cycle. Thus, a deposition process comprises at least one deposition cycle in which the catalyst, the silicon precursor and the plasma are provided into the reaction chamber. In some embodiments, substantially all the deposition cycles of a deposition process comprise providing the catalyst, the silicon precursor and the plasma into the reaction chamber. Such deposition schemes may be denoted "ABC" deposition schemes, wherein A denotes providing a catalyst into the reaction chamber, B denotes providing a silicon precursor into the reaction chamber and C denotes providing a plasma into the reaction chamber. The reaction chamber may be purged after providing the catalyst, the silicon precursor and/or the plasma into the reaction chamber. The ABC deposition cycle may be repeated a predetermined number of times to achieve desired thickness of material comprising silicon and oxygen [n(A+B+C)], wherein n is the number of deposition cycles. For example, n may be from 1 to about 1,000, or from about 5 to about 1,000, or from about 10 to about 1,000, or from about 100 to about 1,000. In some embodiments, n is from about 3 to about 500, or from about 5 to about 500, or from about 10 to about 500, or from about 50 to about 500. In some embodiments, n is from about 50 to about 300, or from about 10 to about 200, or from about 200 to about 600. The number of repetitions of the deposition cycle depends on the per-cycle growth rate (gpc) of the material comprising silicon and oxygen and of the desired thickness of the deposited material.

In some embodiments, a deposition process according to the current disclosure comprises at least one deposition cycle that does not contain providing the catalyst into the reaction chamber. Therefore, in one aspect, a method of selectively depositing material comprising silicon and oxygen on a first surface of a substrate relative to a second surface of the substrate by a cyclic deposition process is disclosed, in which the method comprises providing a substrate into a reaction chamber, providing a catalyst to the reaction chamber in a vapor phase and performing a silicon and oxygen subcycle. The silicon and oxygen subcycle comprises alternately and sequentially providing a silicon precursor comprising an alkoxy silane into the reaction chamber in a vapor phase, and providing a plasma into the reaction chamber in vapor phase, to form material comprising silicon and oxygen on the first surface.

In such embodiments, the process comprises a master cycle comprising providing a catalyst into the reaction chamber and a silicon and oxygen subcycle, wherein the silicon and oxygen subcycle is performed at least twice for each time a catalyst is provided into the reaction chamber. Providing the catalyst into the reaction chamber may comprise providing the catalyst into the reaction chamber and purging the reaction chamber. Providing the catalyst into the reaction chamber may comprise providing a catalyst into the reaction chamber and not purging the reaction chamber. The silicon and oxygen subcycle may comprise providing a silicon precursor into the reaction chamber, optionally purging the reaction chamber, providing a plasma into the reaction chamber and, again optionally, purging the reaction chamber. Such a deposition scheme may be described as n[A+m(B+C)], wherein A denotes providing a catalyst into the reaction chamber, B denotes providing a silicon precursor into the reaction chamber and C denotes providing a plasma into the reaction chamber. If the reaction chamber is purged after providing a catalyst or a precursor into the reaction chamber, the phase A, B and/or C, respectively, comprises the purge step. In such embodiments, phase A, for example, may comprise several repetitions of providing a catalyst into the reaction chamber instead of providing a single pulse of the catalyst. The number of master cycles (n) may vary according to growth speed of the deposited material and desired material thickness as indicated above. m may be varied to regulate growth speed and composition of the material comprising silicon and oxygen. In some embodiments, metal or semimetal of the catalyst may be incorporated into the material comprising silicon and oxygen, and the metal content may be regulated by increasing the number of silicon and oxygen subcycles relative to providing the catalyst into the reaction chamber to reduce metal incorporation, and vice versa.

In some embodiments, a master cycle deposition scheme may be described as n(m(A+C)+o(B+C)). In such embodiments, at least one of the metal oxide subcycle (A+C) and the silicon and oxygen subcycle (B+C) are performed more than once before performing the other subcycle. With these embodiments, nanolaminate structures comprising alternately a metal oxide and silicon oxide may be deposited. The values of m and o, each of which may vary independently, will determine the thickness of each material layer, and the ratio between m and o may determine the proportions of the two materials within the deposited material. Both of these may influence the characteristics of the deposited layer, which in turn may allow tuning the layer for different uses and applications.

Therefore, in a further aspect, a method of selectively depositing material comprising silicon and oxygen on a first surface of a substrate relative to a second surface of the substrate by a cyclic deposition process is disclosed. In this aspect, the method comprises providing a substrate into a reaction chamber, performing a metal oxide subcycle, said subcycle comprising providing alternately and sequentially a catalyst and a first oxygen reactant comprising oxygen and hydrogen into the reaction chamber in a vapor phase, performing a silicon and oxygen subcycle, said subcycle comprising alternately and sequentially providing a silicon precursor comprising an alkoxy silane into the reaction chamber in a vapor phase and providing a plasma into the reaction chamber in vapor phase, to form material comprising silicon and oxygen on the first surface.

In some embodiments, the method further comprises an activation treatment before deposition of the material comprising silicon and oxygen, wherein the activation treatment comprises providing a catalyst into the reaction chamber in a vapor phase; and providing a first oxygen reactant into the reaction chamber in a vapor phase. In some embodiments, the catalyst and the first oxygen reactant are provided into the reaction chamber cyclically in the activation treatment. In some embodiments, the substrate may be exposed to the catalyst and to the first oxygen reactant alternately and sequentially. In some embodiments, the activation treatment is performed directly before the deposition of the material comprising silicon and oxygen deposition is started. The activation treatment may be performed in the same deposition assembly in which the material comprising silicon and oxygen is deposited. In some embodiments, the activation treatment is performed in the same multi-station deposition chamber in which the material comprising silicon and oxygen is deposited. For example, DMAI and water may be provided cyclically, for example alternately and sequentially, into the reaction chamber in vapor phase, with 1 second pulse length for each reactant. In some embodiments, the catalyst pulse length during the activation treatment is from about 0.5 seconds to about 10 seconds, such as 1 second, 2 seconds or 6 seconds. In some embodiments, the first oxygen reactant pulse length during the activation treatment is from about 0.5 seconds to about 10 seconds, such as 1 second, 2 seconds or 6 seconds. The pressure during the activation treatment may be the same pressure used during the deposition of material comprising silicon and oxygen.

For example, DMAI and water may be provided cyclically, for example alternately and sequentially, into the reaction chamber in vapor phase, with 1 second pulse length for each reactant. In some embodiments, the catalyst pulse length during the activation treatment is from about 0.5 seconds to about 10 seconds, such as 1 second, 2 seconds or 6 seconds. In some embodiments, the first oxygen reactant pulse length during the activation treatment is from about 0.5 seconds to about 10 seconds, such as 1 second, 2 seconds or 6 seconds. The pressure during the activation treatment may be the same pressure used during the deposition of material comprising silicon and oxygen. In some embodiments, the activation treatment is performed at a pressure of about 2 to 10 Torr, such as at a pressure of about 6 Torr or about 8 Torr.

In some embodiments, the activation treatment is performed at a pressure of about 2 to 10 Torr, such as at a pressure of about 6 Torr or about 8 Torr.

In some embodiments, an activation treatment may be performed by providing an oxidant, such as oxygen or hydrogen peroxide, into the reaction chamber. In some embodiments, an activation treatment may be performed by providing plasma, such as hydrogen plasma, oxygen plasma or a combination thereof into the reaction chamber. In some embodiments, an activation treatment may be a treatment by hydrogen gas, or by vapor-phase water.

Thus, in some embodiments, the deposition process comprises an activation treatment before the initiation of the actual material growth. In such embodiments, the deposition of material comprising silicon and oxygen may be performed by any of the schemes described above. For example, the deposition scheme may be n(A+C)+m(A+B+C), where n(A+C) is the activation cycle, and the sequence A+B+C is repeated as long as the desired material thickness is achieved (i.e. m times). Alternatively, the deposition scheme performed after the activation cycle (n(A+C) may be, for example, n[A+m(B+C)] or n(m(A+C)+o(B+C). Using an activation treatment before deposition may reduce the number of cycles needed for depositing a desired thickness of material comprising silicon and oxygen. In some embodiments, the faster growth may be due to reduced delay in growth initiation. Without limiting the current disclosure to any specific theory, the deposition may be initiated in a more uniform manner throughout the first surface relative to deposition schemes without an activation treatment. This may have advantages especially in embodiments, in which thin layers of material comprising silicon and oxygen are sought after. A thin silicon and oxygen-comprising material layer may be, for example, less than 15 nm in thickness. For example, the thickness of a thin silicon and oxygen-comprising material layer may be from about 2 nm to about 10 nm, for example 3 nm, 5 nm, or 8 nm. An activation treatment may lead to earlier layer closure, therefore enabling the deposition of substantially or completely continuous layers having a lower thickness. Additionally, an activation treatment may lead to lower number of defects. Using an activation treatment may additionally allow for uniform deposition into narrow-pitch structures, such as structures comprises gaps having a width of 40 nm or less, or having a width of 30 nm or less, or having a width of 25 nm or less.

A deposition process may be any combination of above deposition schemes.

Purging

As used herein, the term "purge" may refer to a procedure in which vapor phase precursors and/or vapor phase byproducts are removed from the substrate surface for example by evacuating the reaction chamber with a vacuum pump and/or by replacing the gas inside a reaction chamber with an inert or substantially inert gas such as argon or nitrogen. Purging may be effected between two pulses of gases which react with each other. However, purging may be effected between two pulses of gases that do not react with each other. For example, a purge, or purging may be provided between pulses of two precursors or between a catalyst and a precursor. Purging may avoid, or at least reduce, gas-phase interactions between the two gases reacting with each other. It shall be understood that a purge can be effected either in time or in space, or both. For example in the case of temporal purges, a purge step can be used e.g. in the temporal sequence of providing a first precursor to a reactor chamber, providing a purge gas to the reactor chamber, and providing a second precursor to the reactor chamber, wherein the substrate on which a material is deposited does not move. For example in the case of spatial purges, a purge step can take the following form: moving a substrate from a first location to which a first precursor is continually supplied, through a purge gas curtain, to a second location to which a second precursor is continually supplied. Purging times may be, for example, from about 0.01 seconds to about 20 seconds, from about 0.05 s to about 20 s, or from about 1 s to about 20 s, or from about 0.5 s to about 10 s, or between about 1 s and about 7 seconds, such as 5 s, 6 s or 8 s. However, other purge times can be utilized if necessary, such as where highly conformal step coverage over extremely high aspect ratio structures or other structures with complex surface morphology is needed, or in specific reactor types, such as a batch reactor, may be used.

Plasma Process

In the methods according to the current disclosure, plasma is provided into the reaction chamber to form a reactive species for forming a material comprising silicon and oxygen on the first surface. Thus, the cyclic deposition methods according to the current disclosure may be termed plasma-enhanced deposition methods. Examples of plasma-enhanced cyclic deposition methods include plasma-enhanced atomic layer deposition (PEALD) or plasma-enhanced cyclic chemical vapor deposition (cyclic PECVD).

In some embodiments, plasma may be formed remotely via plasma discharge ("remote plasma") away from the substrate or reaction space. In some embodiments, plasma may be formed in the vicinity of the substrate or directly above substrate ("direct plasma"). In some embodiments, the plasma is produced by gas-phase ionization of a gas with a radio frequency (RF) power. The power for generating RF-generated plasma can be varied in different embodiments of the current disclosure. In some embodiments, the RF power is between 30 W and 100 W. In some embodiments, the RF power may be from 30 W to 80 W, such as, 40 W, 50 W or 60 W. In some embodiments, the RF power may be from 30 W to 70 W. Adjusting the power of the RF plasma generator during the deposition of the material comprising silicon and oxygen may affect the amount/density and energy of reactive species generated by plasma. Without limiting the current invention to any specific theory, higher RF power may lead to generation of higher energy ions and radicals. This may affect the damage the reactive species cause on the surfaces of the substrate. For example, in embodiments in which the second surface comprises a passivation layer, too high plasma power should be avoided.

In plasma-enhanced deposition, the chemical reactions are promoted by reactive species in plasma. Therefore, lower temperatures compared to thermal (i.e. processes excluding plasma) may be used. Thus, using plasma-enhanced cyclic deposition processes, such as PEALD or cyclic PECVD, the thermal budget of the manufacturing process may be decreased. In some embodiments, the vapor deposition process according to the current disclosure is a plasma-enhanced ALD process. In some embodiments, material comprising silicon and oxygen is deposited at a temperature from about 80° C. to about 400° C., such as at a temperature from about 200° C. to about 350° C. For example, material comprising silicon and oxygen may be deposited at a temperature from about 100° C. to about 350° C., or at a temperature from about 100° C. to about 250° C., or at a temperature from about 100° C. to about 200° C. In some embodiments, the cyclic deposition process according to the current disclosure may be performed at ambient temperature. In some embodiments, ambient temperature is room temperature (RT). In some embodiments, ambient temperature may vary between 20° C. and 30° C.

The catalyst may be provided into the reaction chamber at the same temperature as the material comprising silicon and oxygen is deposited. Alternatively, the temperature during providing the catalyst into the reaction chamber is different from the temperature at which the material comprising silicon and oxygen is deposited. In some embodiments, the substrate is heated before providing the catalyst into the reaction chamber. In embodiments comprising depositing a passivation blocking layer and a passivation layer, the temperature for the deposition of said layers may be independently selected. For example, a temperature during the silylation process may be from about 50° C. to about 500° C., or from about 100° C. to about 300° C. As another example, a polyimide-comprising passivation layer may be deposited at temperatures below 190° C., and subsequently heat-treated at a temperature of about 190° C. or higher (such as 200° C. or 210° C.) to increase the proportion of the organic material from polyamic acid to polyimide, and to improve the passivation properties of the passivation layer.

Pressure

The methods according to the current disclosure may be performed in reduced pressure. In some embodiments, a pressure within the reaction chamber during the deposition process according to the current disclosure is less than about 500 Torr, or a pressure within the reaction chamber during the deposition process is between about 0.1 Torr and about 500 Torr, or between about 0.5 Torr and about 100 Torr, or between about 1 Torr and about 20 Torr. In some embodiments, a pressure within the reaction chamber during the deposition process is less than about 100 Torr, less than about 50 Torr, less than about 20 Torr or less than about 10 Torr.

In some embodiments, a pressure during a deposition cycle is lower than about 20 Torr. In some embodiments, a pressure during a deposition cycle is lower than about 10 Torr. In some embodiments, a pressure during a deposition cycle is higher than about 5 Torr. In some embodiments, a pressure during a deposition cycle is higher than about 10 Torr. In some embodiments, a pressure during a deposition cycle is between about 3 Torr and about 25 Torr. In some embodiments, the process may be performed in constant pressure. In some embodiments, the pressure may be change during the deposition process. For example, a different pressure may be used for an activation treatment than for the deposition process. In some embodiments, a pressure may be selected independently for different subcycles. However, in some embodiments, different pressures may be used during providing different reactants into the deposition chamber. In some embodiments, a first pressure is used during providing the catalyst into the reaction chamber, and a second pressure is used when providing the silicon precursor into the reaction chamber. In some embodiments, the second pressure is used when providing the plasma into the reaction chamber. In some embodiments, the second pressure is used when providing the silicon precursor into the reaction chamber and providing the plasma into the reaction chamber. In some embodiments, the first pressure is lower than the second pressure. For example, in some embodiments, a first pressure may be lower than about 10 Torr or lower than about 20 Torr. In some embodiments, the first pressure is lower than about 5 Torr, such as about 0.5 Torr, about 1 Torr, about 2 Torr or about 3 Torr. In some embodiments, the second pressure is higher than or equal to about 5 Torr. In some embodiments, the second pressure is lower than or equal to about 20 Torr, or lower than or equal to about 10 Torr. In some embodiments, a second pressure is between about 5 Torr and about 12 Torr.

Reactants

Silicon Precursor

As used herein, "silicon precursor" includes a gas or a material that can become gaseous and that can be represented by a chemical formula that includes silicon. In some embodiments, a silicon precursor does not contain hydroxyl groups. A silicon precursor according to the current disclosure comprises an alkoxy silane. In some embodiments, a silicon precursor is an alkoxy silane. In some embodiments, an alkoxy silane according to the current disclosure comprises four identical alkoxy groups. In some embodiments, an alkoxy silane according to the current disclosure comprises a carboxylate group. In some embodiments, an alkoxy silane according to the current disclosure does not contain hydroxyl groups. In some embodiments, an alkoxy silane according to the current disclosure comprises a silyl ester. In some embodiments, the alkoxy silane is selected from a group consisting of tetraacetoxysilane (tetraacetyl ortosilicate), tetramethoxysilane, tetraethoxysilane (tetraethyl ortosilicate), trimethoxysilane, triethoxysilane and trimethoxy(3-methoxypropyl)silane. In some embodiments, a trialkoxy silane according to the current disclosure comprises a compound of formula $RSi(OR')_3$, wherein R is selected from H, 3-aminopropyl, $CHCH_3$, 3-methoxypropyl, and R' is selected from $CH_3$ and $CH_2CH_3$. In some embodiments, a triethoxy silane according to the current disclosure comprises a compound of formula $HSi(OCH_2CH_3)_3$. In some embodiments, a triethoxy silane according to the current disclosure comprises triethoxy-3-aminopropyl silane (Si$(OCH_2CH_3)_3CH_2CH_2CH_2NH_2$). In some embodiments, a triethoxy silane according to the current disclosure comprises triethoxy(ethyl)silane (Si$(OCH_2CH_3)_3CHCH_3$).

Alkoxy silanes, for example tetraethoxysilane and trimethoxy(3-methoxypropyl)silane, may have advantages over other silicon precursors in selective deposition applications, as their reactivity is lower. In some embodiments, an alkoxy silane according to the current disclosure comprises three alkoxy groups and one alkoxy-substituted alkyl bound to the silicon atom. Thus, a silicon atom may be bound to three oxygen atoms and one carbon atom. In some embodiments, the silicon atom of the alkoxy silane is bound to four oxygen atoms. This may apply for OH groups available on the surface of dielectric materials and for metal and metallic surfaces.

Alkoxy silanes may also have lower reactivity towards organic passivation agents. In some embodiments, the reduced reactivity towards passivation agents is more pronounced than towards dielectric surfaces. In some embodiments, it is possible to select the process conditions in a way that growth of material comprising silicon and oxygen on organic passivation is substantially completely prevented. The reduced reactivity of alkoxy silanes towards organic passivation agents, such as polyimide and/or polyamic acid, may also be more robust than for other silicon precursors, and may be able to tolerate some plasma-induced damage on an organic passivation agent. Taken together, alkoxy silanes in general, and tetraethoxysilane in particular, may have a wider selectivity window compared to methods known in the art.

In some embodiments, the silicon precursor is provided two or more times in at least one deposition cycle. In some embodiments, the silicon precursor is provided in two or more consecutive pulses during a deposition cycle. In some embodiments, the silicon precursor comprises tetraethoxysilane. In some embodiments, the silicon precursor consists essentially of tetraethoxysilane. In some embodiments, the silicon precursor comprises trimethoxy(3-methoxypropyl)silane. In some embodiments, the silicon precursor consists essentially of trimethoxy(3-methoxypropyl)silane.

Catalyst

A metal or metalloid catalyst ("catalyst") is used to enhance or to enable deposition of material comprising silicon and oxygen on the first surface. To obtain advantages according to the current disclosure, a silicon precursor as described above may be combined with a catalyst. This may allow the deposition using an alkoxy silane according to the current disclosure while retaining selectivity of deposition.

A catalyst according to the current disclosure is a metal or a metalloid catalyst. In some embodiments, the metal catalyst is a metal or metalloid compound comprising B, Zn, Mg, Mn, La, Hf, Al, Zr, Ti, Sn, Y or Ga. In some embodiments, the catalyst is a metal halide, organometallic or metalorganic compound. In some embodiments, the catalyst is an alkylaluminium, alkylboron or alkylzinc compound that is able to react with the first surface. For example, the catalyst may comprise trimethyl aluminum (TMA), triethylboron (TEB), or diethyl zinc. In some embodiments, the metal or metalloid catalyst is a metalloid catalyst. In some embodiments, the catalyst comprises an alkylborane. In some embodiments, the catalyst comprises a trialkylborane. In some embodiments, the catalyst comprises a trimethylborane or a triethylborane.

In some embodiments, the catalyst comprises a compound having the formula $MR_xA_{3-x}$, wherein x is from 1 to 3, R is a C1-C5 alkyl ligand, M is B, Zn, Mg, Mn, La, Hf, Al, Zr, Ti, Sn, Y or Ga and A is a halide, alkylamine, amino, silyl or derivative thereof. In some embodiments, R is a C1-C3 alkyl ligand. In some embodiment R is a methyl or ethyl group. In some embodiments, the M is boron. In some embodiments, the catalyst is $ZnR_xA_{2-x}$, wherein x is from 1 to 2, R is a C1-C5 alkyl ligand, and A is a halide, alkylamine, amino, silyl or derivative thereof. In some such embodiments R is a C1-C3 alkyl ligand. In some embodiment R is a methyl or ethyl group.

In some embodiments, the catalyst is an aluminum catalyst. Examples of Al compounds that can be used include trimethyl aluminum (TMA), dimethylaluminumchloride, aluminum trichloride ($AlCl_3$), dimethylaluminum isopropoxide (DMAI), tris(tertbutyl)aluminum (TTBA), tris(isopropoxide)aluminum (TIPA), tris(dimethylamino) aluminum (TDMAA) or triethyl aluminum (TEA). In some embodiments, the aluminum catalyst comprises is a heteroleptic aluminum compound. In some embodiments, the heteroleptic aluminum compound comprises an alkyl group and another ligand, such as a halide, for example Cl. In some embodiments, the aluminum catalyst comprises dimethylaluminumchloride. In some embodiments, the aluminum catalyst comprises an alkyl precursor comprising two different alkyl groups as ligands. In some embodiments, the aluminum compound is an aluminum isopropoxide. In some embodiments, the aluminum catalyst comprises a metalorganic compound. In some embodiments, the aluminum catalyst comprises an organometallic compound. In some embodiments, the aluminum catalyst is an aluminum compound such as trimethyl aluminum (TMA), dimethylaluminumchloride, aluminum trichloride (AlCl3), dimethylaluminum isopropoxide (DMAI), tris(tertbutyl)aluminum (TTBA), tris(isopropoxide)aluminum (TIPA), tris(dimethylamino) aluminum (TDMAA) or triethyl aluminum (TEA).

In some embodiments, the catalyst is a zirconium compound, such as ZrD-04. In some embodiments, the catalyst is tetrakis(ethylmethylamino)zirconium (TEMAZ). In some embodiments, the catalyst is $ZrCl_4$.

In some embodiments, the catalyst is a lanthanum compound, such as tris(isopropyl-cyclopentadienyl)lanthanum $(LA(iPrCp)_3)$. In some embodiments, the catalyst is a titanium compound, such as titanium isopropoxide (TTIP) or $TiCl_4$. In some embodiments, the catalyst is a gallium compound, such as trimethylgallium (TMG). In some embodiments, the catalyst is a hafnium compound, such as HfD-04, $HfCl_4$ or $Hf(NO_3)_4$.

The catalyst may be provided to the reaction chamber holding the substrate in a single pulse or in a sequence of multiple pulses. In some embodiments, the catalyst is provided in a single long pulse. In some embodiments, the catalyst is provided in multiple shorter pulses. The pulses may be provided sequentially. In some embodiments, the catalyst is provided in 1 to 25 pulses of from about 0.1 to about 60 seconds. In some embodiments, the catalyst is provided in a single pulse of about 0.1 to about 60 seconds, about 1 to 30 seconds or about 25 seconds. In some embodiments, the catalyst is provided into the reaction chamber in every deposition cycle. In some embodiments, the catalyst is provided into the reaction chamber in every deposition cycle in a single pulse. The pulse length in each deposition cycle may be from about 0.1 seconds to about 10 seconds, such as from about 1 second to about 5 seconds. In between catalyst pulses, excess catalyst may be removed from the reaction space. For example, the reaction chamber may be evacuated and/or purged with an inert gas. The purge may be, for example for about 1 to 30 seconds or more. Purging means that vapor phase catalyst and/or vapor phase byproducts, if any, are removed from the reaction chamber such as by evacuating the chamber with a vacuum pump and/or by replacing the gas inside the reaction chamber with an inert gas. In some embodiments, vapor phase catalyst is removed from the substrate surface by moving the substrate from the reaction space comprising the vapor phase catalyst.

The term "catalyst" is used throughout the disclosure for simplicity. It is appreciated that in reality, the surface-bound, catalytically active substance may be chemically different from the substance provided into the reaction chamber in vapor phase.

Plasma

In embodiments according to the current disclosure, plasma is provided into the reaction chamber for depositing material comprising silicon and oxygen on the substrate. Plasma is generated from a gas, which is herein termed a plasma precursor for simplicity. It is understood that the gas may be provided from a vessel, in which the gas can be present in a gas phase or in a liquid phase, depending on the element and design choices of the deposition assembly used for the deposition process.

In some embodiments, plasma is generated from a gas containing substantially only a noble gas. In some embodiments, the plasma is generated from a noble gas. In such embodiments, the plasma precursor is thus a noble gas. In some embodiments, the noble gas is selected from a group consisting of helium, neon and argon. In some embodiments, the plasma is generated from a gas comprising only, or substantially only, one or more noble gases. In some embodiments, the plasma is generated from a gas comprising only, or substantially only, one noble gas. In some embodiments, the plasma is generated from a gas comprising only, or substantially only, argon. In such embodiments, the plasma precursor is thus argon. In some embodiments, the plasma is generated from a gas comprising only, or substantially only, helium. In some embodiments, the plasma is generated from a gas comprising only, or substantially only, neon. In some embodiments, the plasma is generated from a gas comprising only, or substantially only, neon. In some embodiments, the plasma is generated from a noble gas and an additional element. In some embodiments, the additional element is selected from hydrogen and nitrogen. In some embodiments, plasma is generated from a gas containing substantially only a noble gas and hydrogen. In some embodiments, the plasma is generated from gas comprising substantially only argon and hydrogen. In some embodiments, the additional element is nitrogen. In some embodiments, plasma is generated from a gas containing substantially only argon and nitrogen. In some embodiments, the additional element is nitrogen, and the material comprising silicon and oxygen further comprises nitrogen. However, in some embodiments, plasma may be generated from a gas containing three elements or compounds. In some embodiments, plasma may be generated from a gas containing four elements or compounds.

The plasma ion energy may be kept low in the embodiments of the current disclosure. Plasma ion energy may affect the likelihood of both damaging surfaces, such as passivation layers, on the substrate and rate of process. Too high plasma energy may damage possible passivation layer, and adversely affect the selectivity of the deposition. In some embodiments, the plasma is RF plasma, and the plasma power does not exceed 100 W. In some embodiments, plasma ion energy does not exceed 160 eV. In some embodiments, the maximum ion energy of the plasma is from about 25 eV to about 160 eV, such as from about 30 eV to about 150 eV or from about 30 eV to about 120 eV, or from about 30 eV to about 70 eV. In some embodiments, the maximum ion energy of the plasma is about 40 eV about 50 eV, about 60 eV, about 80 eV or 100 eV. Using mild plasma treatment to deposit material comprising silicon and oxygen according to the current disclosure may avoid the use of oxidizers, such as water, if so desired. The growth rate of the material comprising silicon and oxygen may still remain relatively fast in the absence of oxidizers, possibly providing advantages in high-volume manufacturing.

Without limiting the current disclosure to any specific theory, the silicon precursor may chemisorb onto the substrate surface through —OH groups available on the substrate surface. An oxygen atom of an alkoxy group in the silicon precursor may react with the substrate surface, leading to bonding between surface-bound oxygen and the silicon atom of the alkoxy silane.

Alkoxide Enhancer

In some embodiments, an alkoxide enhancer is provided into the reaction chamber after providing a silicon precursor into the reaction chamber. Without limiting the current disclosure to any specific theory, an alkoxide enhancer reactant may reduce some of the alkoxide groups in the silicon precursor chemisorbed on the substrate surface into hydroxyl groups, which may enhance the chemisorption of additional silicon precursor during the following deposition cycles. In some embodiments, the alkoxide enhancer comprises an alkoxide. In some embodiments, the alkoxide enhancer is an alkoxide. In some embodiments, the alkoxide enhancer comprises an alcohol. In some embodiments, the alkoxide enhancer is an alcohol. An alcohol according to the current disclosure may be a primary alcohol. For example, an alcohol according to the current disclosure may be methanol, ethanol, propanol, 1-butanol or isobutanol. An alcohol according to the current disclosure may be a secondary alcohol. In some embodiments, an alcohol may be 2-propanol.

First Oxygen Reactant

In embodiments comprising a metal oxide subcycle, a first oxygen reactant may be used together with the catalyst to deposit metal oxide, and/or to amend the substrate surface to increase the deposition rate of the material comprising silicon and oxygen. The term first oxygen reactant is used for this reactant for clarity, to differentiate it from other oxygen-containing chemistries used in some embodiments of the process, such as the alkoxide enhancer and the second oxygen reactant used in connection with providing plasma into the reaction chamber.

A first oxygen reactant according to the current disclosure comprises hydrogen and oxygen. In some embodiments, the first oxygen reactant does not contain carbon, i.e. it is carbon-free. In some embodiments, the first oxygen reactant does not contain silicon, i.e. it is silicon-free. In some embodiments, the first oxygen reactant comprises water. In some embodiments, the first oxygen reactant consists substantially of, or consists of water. In some embodiments, the first oxygen reactant comprises hydrogen peroxide. In some embodiments, the first oxygen reactant consists substantially of, or consists of hydrogen peroxide.

In some embodiments, the first oxygen reactant comprises a carboxyl group. In some embodiments, the first oxygen reactant comprises a carboxylic acid. A carboxyl group-comprising first oxygen reactant may be a C1 to C7 carboxylic acid, or a C1 to C3 carboxylic acid. Exemplary carboxylic acids according to the current disclosure are formic acid, acetic acid, propionic acid, butyric acid, pentanoic acid, hexanoic acid, heptanoic acid, isobutyric acid, 2-methylbutanoic acid, 3-methylbutanoic acid, pivalic acid, 2,2-dimethylbutanoic acid, 2-methylpentanoic acid, 3-methylpentanoic acid, 2-ethylbutanoic acid, 2-ethylpentanoic acid and 2,3-dimethylbutanoic acid.

In some embodiments, the first oxygen reactant comprises a carboxyl group. In some embodiments, the first oxygen reactant comprises a carboxylic acid. A carboxyl group-comprising first oxygen reactant may be a C1 to C7 carboxylic acid, or a C1 to C3 carboxylic acid. Exemplary carboxylic acids according to the current disclosure are formic acid, acetic acid, propionic acid, butyric acid, pentanoic acid, hexanoic acid, heptanoic acid, isobutyric acid, 2-methylbutanoic acid, 3-methylbutanoic acid, pivalic acid, 2,2-dimethylbutanoic acid, 2-methylpentanoic acid, 3-methylpentanoic acid, 2-ethylbutanoic acid, 2-ethylpentanoic acid and 2,3-dimethylbutanoic acid.

Second Oxygen Reactant

In some embodiments of the method according to the current disclosure, a second oxygen reactant is provided into the reaction chamber. A second oxygen reactant is used together with providing plasma into the reaction chamber, either simultaneously with providing plasma into the reaction chamber or sequentially relative to providing the plasma to the reaction chamber. In some embodiments, the second oxygen reactant comprises molecular oxygen ($O_2$). In some embodiments, the second oxygen reactant according to the current disclosure comprises hydrogen and oxygen. In some embodiments, the second oxygen reactant comprises water. In some embodiments, the second oxygen reactant comprises hydrogen peroxide. In some embodiments, the second oxygen reactant does not contain carbon, i.e. it is carbon-free. In some embodiments, the second oxygen reactant does not contain silicon, i.e. it is silicon-free. In some embodiments, the second oxygen reactant comprises water. In some embodiments, the second oxygen reactant is water. In some embodiments, the second oxygen reactant comprises hydrogen peroxide. In some embodiments, the second oxygen reactant is hydrogen peroxide. In some embodiments, the use of a second oxygen reactant may not be desired. For example, in embodiments, in which the second surface comprises a metal, the metal may be oxidized, which may not be desired. Thus, in some embodiments, a second oxygen reactant is not used. A second oxygen reactant may be used in embodiments, in which the first surface and the second surface are not easily oxidized, or in which some degree of oxidation on the surface may be tolerated. For example, in some embodiments, in which the first surface and the second surface are different dielectric materials, a second oxygen reactant may be used.

Although using a second oxygen reactant may be used in some embodiments, in some embodiments, the process is performed in the absence of second oxygen reactant. Thus, in some embodiments, the material comprising silicon and oxygen may be deposited in the absence of other oxygen sources that the silicon precursor.

In some embodiments, the first oxygen reactant and the second oxygen reactant may be the same. Alternatively, the first oxygen reactant and the second oxygen reactant may be different. In some embodiments, two different second oxygen reactants may be used.

Process Schemes

In some embodiments, a deposition scheme according to the current disclosure may be described as n(A+B+C), wherein n is the number of deposition cycles and wherein A denotes providing a catalyst into the reaction chamber, B denotes providing a silicon precursor into the reaction chamber and C denotes providing plasma into the reaction chamber. The catalyst may be provided to the reaction chamber holding the substrate in a single pulse or in a sequence of multiple pulses. In some embodiments, the catalyst is provided in a single long pulse. In some embodiments, the catalyst is provided in multiple shorter pulses, such as from 2 to about 30 pulses. The pulses may be provided sequentially. There may be a purge between two consecutive catalyst pulses. The silicon precursor may be provided to the reaction chamber holding the substrate in a single pulse or in a sequence of multiple pulses. In some embodiments, the silicon precursor is provided in a single long pulse. In some embodiments, the silicon precursor is provided in multiple shorter pulses, such as from 2 to about 30 pulses. For example, a master cycle may comprise providing a catalyst into the reaction chamber in a single pulse, then providing the silicon precursor into the reaction chamber in multiple pulses, for example, in about 15 to about 25 pulses, and then providing argon plasma into the reaction chamber in a single pulse. The pulses may be provided sequentially. There may be a purge between two consecutive silicon precursor pulses.

In some embodiments, a method according to the current disclosure can be written out as n(A+B+C+D), wherein n is the number of deposition cycles, A denotes providing a catalyst into the reaction chamber, B denotes providing a silicon precursor into the reaction chamber, C denotes providing plasma into the reaction chamber and D denotes providing a second oxygen reactant, such as molecular oxygen, or an alkoxide enhancer, such as an alcohol, into the reaction chamber. In some embodiments, a second oxygen reactant or an alkoxide enhancer is provided into the reaction chamber before providing plasma into the reaction chamber (denoted as n(A+B+D+C)). In some embodiments, some of the reactants and/or precursors may not be provided into the reaction chamber in every deposition cycle. In such embodiments, the deposition process comprises master cycles during which all of the precursors and reactants are provided into the reaction chamber. For example, a deposition process according to the current disclosure may be denoted as n(A+m(B+C+D)) in which n is the number of master cycles, and m is the number of subcycles performed in every master cycle. In this embodiment silicon precursor (B), plasma (C) and a second oxygen reactant or an alkoxide enhancer (D) are provided into the reaction chamber in every subcycle. As above, a second oxygen reactant or an alkoxide enhancer may be provided into the reaction chamber before plasma (n(A+m(B+D+C))). Although denoted by a single letter D for simplicity, a second oxygen reactant and an alkoxide enhancer may be used independently of each other as presented above. One or both of them may be used in a deposition process according to the current disclosure.

In some embodiments, a method according to the current disclosure comprises nested subcycles. For example, the process may be described as n(A+o(m(B+C)+D)), in which a silicon precursor and plasma (or silicon precursor and a second oxygen reactant/alkoxide enhancer, as in n(A+o(m(B+D)+C))) are provided into the reaction chamber m times after which second oxygen reactant/alkoxide enhancer (or plasma, as the case may be) is provided into the reaction chamber, and this subcycle is repeated o times. As a part of the master cycle, a catalyst is provided into the reaction chamber (A), and the number of master cycles is described by n as above. In all of the embodiments described herein, it is possible that providing a second oxygen reactant or an alkoxide enhancer into the reaction chamber may be partially overlapping with providing another precursor or reactant into the reaction chamber.

In some embodiments, two of the reactants may be co-pulsed, i.e. the two reactants are provided at least partially simultaneously into the reaction chamber. For example, in some embodiments, it may be advantageous to provide a metal catalyst and a silicon precursor simultaneously into the reaction chamber (denoted A/B below). In some embodiments, the pulses of metal catalyst and the silicon precursor overlap partially. In some embodiments, the pulses of metal catalyst and the silicon precursor overlap at least partially. In some embodiments, the pulses of metal catalyst and the silicon precursor overlap completely. In some embodiments, the deposition scheme according to the current disclosure may be denoted n(A/B+C), wherein A denotes a catalyst, B a silicon precursor and C a plasma. In some embodiments, the deposition scheme according to the current disclosure may be denoted n(m(A/B+C)+o(B+C)), where n, m and o are independent of each other and depict the number of repetitions of the indicated cycle. Further, in some embodiments, a deposition cycle may comprise co-pulsing a silicon precursor and a second oxygen reactant. For example, tetraethoxysilane and water, or tetraethoxysilane and formic acid may be provided into the reaction chamber at least partially simultaneously. It may also be advantageous to co-pulse two different second oxygen reactants, for example water and a carboxylic acid. In some embodiments, silicon precursor and a second oxygen reactant are provided at least partially simultaneously into the reaction chamber. In some embodiments, silicon precursor and a second oxygen reactant are provided at least partially separately into the reaction chamber. In some embodiments, silicon precursor and a second oxygen reactant are provided sequentially into the reaction chamber. In some embodiments, silicon precursor and an alkoxide enhancer are provided at least partially simultaneously into the reaction chamber. In some embodiments, silicon precursor and an alkoxide enhancer are provided at least partially separately into the reaction chamber. In some embodiments, silicon precursor and an alkoxide enhancer are provided sequentially into the reaction chamber.

DRAWINGS

The disclosure is further explained by the following exemplary embodiments depicted in the drawings. The illustrations presented herein are not meant to be actual views of any particular material, structure, device or an apparatus, but are merely schematic representations to describe embodiments of the current disclosure. It will be appreciated that elements in the figures are illustrated for simplicity and clarity and have not necessarily been drawn to scale. For example, the dimensions of some of the elements in the figures may be exaggerated relative to other elements to help improve the understanding of illustrated embodiments of the present disclosure. The structures and devices depicted in the drawings may contain additional elements and details, which may be omitted for clarity.

FIG. 1, panels a) to f) illustrates an embodiment of a method according to the current disclosure schematically. In the drawing, a substrate 100 comprising a first surface 102 and a second surface 104 is depicted. The first surface 102 is blocked relative to the second surface 104 by a blocking layer 106, the second surface 104 is selectively passivated by an organic passivation layer 108 relative to the first surface 102 comprising the blocking layer 106, followed by selective deposition of material comprising silicon and oxygen 112 on the first surface 102 relative to the passivated second surface 104.

Panel a) illustrates a substrate 100 having two surfaces 102, 104 having different material properties. For example, the first surface 102 may be a dielectric surface. The first surface 102 may comprise, consist essentially of, or consist of silicon oxide-based material or another dielectric material described in this disclosure. The second surface 104 may comprise, consist essentially of, or consist of a metal, such as copper (Cu) or other metals disclosed in this disclosure.

Panel b) shows the substrate 100 of panel a) after selective blocking of the second surface 104, such as by silylation. For example, a blocking layer 106 may be formed selectively on a dielectric surface by exposing the substrate 100 to a silylating agent, such as allyltrimethylsilane (TMS-A), chlorotrimethylsilane (TMS-Cl), N-(trimethylsilyl)imidazole (TMS-Im), octadecyltrichlorosilane (ODTCS), hexamethyldisilazane (HMDS), or N-(trimethylsilyl)dimethylamine (TMSDMA).

Panel c) shows the substrate 100 of panel b) after selective deposition of an organic passivation layer 108 on the second surface 104, such as by formation of a SAM or a polyimide-comprising layer.

Panel d) shows the substrate 100 of panel c) following selective deposition of a catalyst 110 on the first surface relative to the polymer passivation layer 108 on the second surface 104. The catalyst may be formed selectively on the first surface 102 by exposing the substrate to a catalyst such as trimethyl aluminum (TMA), dimethylaluminumchloride, aluminum trichloride ($AlCl_3$), dimethylaluminum isopropoxide (DMAI), tris(tertbutyl)aluminum (TTBA), tris(isopropoxide)aluminum (TIPA), tris(dimethylamino) aluminum (TDMAA) or triethyl aluminum (TEA). Although illustrated with an aluminum catalyst, in other embodiments catalysts comprising other metals or metalloids may be used.

Panel e) shows the substrate 100 of panel d) following selective deposition of material comprising silicon and oxygen 112 on the first surface 102 comprising the catalyst relative to the polymer passivated second surface 104. The material comprising silicon and oxygen 112 is deposited by providing a silicon precursors comprising an alkoxy silane, such as tetraethoxysilane into the reaction chamber and providing a plasma into the reaction chamber in accordance with the current disclosure. Without limiting the current disclosure to any specific theory, the alkoxy silane may decompose on the metal atoms on a dielectric surface comprising a catalyst, leading to the deposition of material comprising silicon and oxygen on the first surface. In some exemplary embodiments, the plasma treatment is performed by plasma generated substantially only from argon. Without limiting the current disclosure to any specific theory, a plasma-based deposition process allows for the deposition of material comprising silicon and oxygen, such as silicon oxide and/or metal silicates, with higher growth rate than in thermal processes. Plasma generated from argon, or from other noble metals, may have advantages when certain passivation materials are used. For example, polyimide-containing passivation layers may withstand the plasma treatment so that selective deposition may be continued over several deposition cycles without having to re-deposit the passivation layer. For example, a combination of using dimethyl aluminum isopropoxide as a catalyst, tetraethyl orthosilicate as a silicon precursor and plasma generated from argon, has been found out to be suitable for depositing suitable material comprising silicon and oxygen.

Any material comprising silicon and oxygen 112 deposited on the second surface 104, such as on the polymer-passivated metal layer 108, can be removed by a post-deposition treatment, such as an etch-back process. Because the material comprising silicon and oxygen is deposited selectively on the first surface 102, any material comprising silicon and oxygen 112 left on the passivation layer 108 will be thinner than the material comprising silicon and oxygen deposited on the first surface 102. Accordingly, the post-deposition treatment can be controlled to remove all, or substantially all, of the material comprising silicon and oxygen from over the second surface 104 without removing all of the material comprising silicon and oxygen 112 from over the dielectric surface. Repeated selective deposition and etching back in this manner can result in an increasing thickness of the material comprising silicon and oxygen 112 on the first surface 102 with each cycle of deposition and etch. Repeated selective deposition and etching back in this manner can also result in increased overall selectivity of the material comprising silicon and oxygen 112 deposition on the first surface 102, as each cycle of deposition and etch leaves a clean passivation layer 108 over which the selective material comprising silicon and oxygen is deposited at a lower rate compared to the first surface 102. In other embodiments, material comprising silicon and oxygen over the second surface 104 may be removed during subsequent removal of the passivation layer 108.

Panel f) shows the substrate of panel e) after a post-deposition treatment to remove the passivation layer 108 from the second surface 104, such as by an etch process. In some embodiments, the etch process may comprise exposing the substrate 100 to a plasma. In some embodiments, the plasma for the post-deposition treatment may comprise oxygen atoms, oxygen radicals, oxygen plasma, or combinations thereof. In some embodiments, the plasma may comprise hydrogen atoms, hydrogen radicals, hydrogen plasma, or combinations thereof. In some embodiments, the plasma may comprise noble gas species, for example Ar or He species. In some embodiments, the plasma may consist essentially of noble gas species. In some embodiments, the plasma may comprise other species, for example nitrogen atoms, nitrogen radicals, nitrogen plasma, or combinations thereof. In some embodiments, the etch process may comprise exposing the substrate to an etchant comprising oxygen, for example $O_3$. In some embodiments, the substrate may be exposed to an etchant at a temperature of between about 30° C. and about 500° C., or between about 100° C. and about 400° C. In some embodiments, the etchant may be supplied in one continuous pulse or may be supplied in multiple pulses. The removal of the passivation layer 108 can be used to lift-off any remaining material comprising silicon and oxygen from over the metal layer, either in a complete removal of the passivation layer 108 or in a partial removal of the passivation layer 108 in a cyclical selective deposition and removal.

Figure 2A:
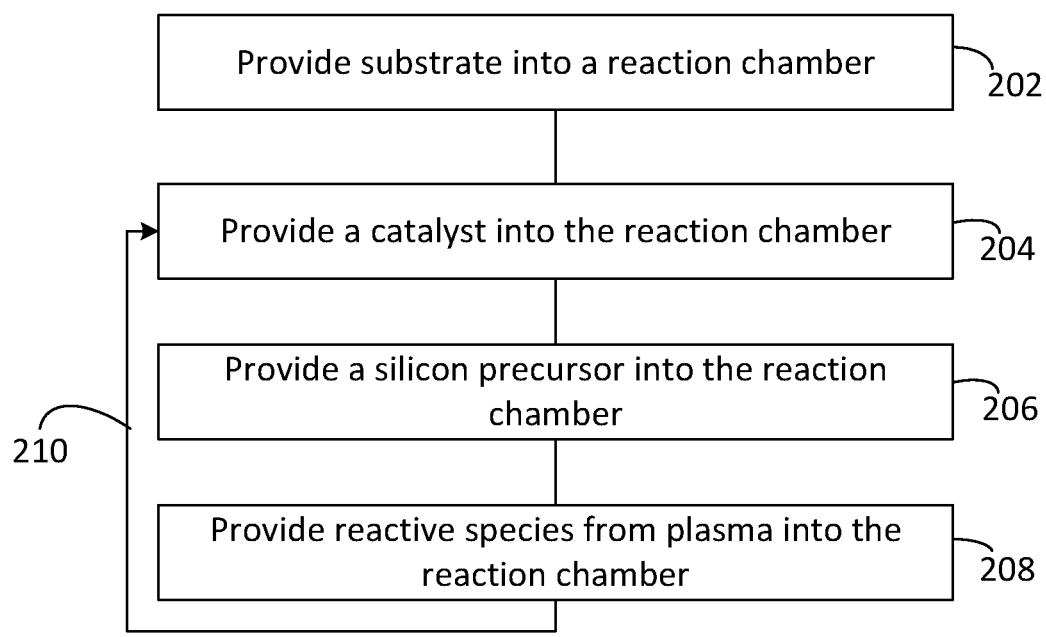
FIG. 2A is a block diagram of exemplary embodiments of a method according to the current disclosure.

FIG. 2A is a block diagram of exemplary embodiments of a method according to the current disclosure. First, a substrate is provided into a reaction chamber at block 202. The substrate comprises a first surface and a second surface as described in the current disclosure. For example, the first surface may be a dielectric surface comprising a passivation blocking agent, such as a silylating agent, and the second surface may be a metal surface, such as copper surface, comprising an organic passivation layer. In an exemplary embodiment, the metal passivation layer comprises polyimide. The deposition of a passivation layer may comprise etching back the deposited passivation layer for improving the accuracy of subsequent selective deposition. The substrate may be heated at block 202 prior to providing a catalyst into the reaction chamber.

After providing the substrate into the reaction chamber, 202, a catalyst is provided into the reaction chamber at block 204 to contact the catalyst with the substrate. The catalyst may be, for example, an aluminum-comprising catalyst, such as dimethylaluminum isopropoxide. The catalyst is provided into the reaction chamber in vapor phase. The duration of providing the catalyst may be, for example from about 0.5 seconds to about 10 seconds, such as about 1 second, about 2 seconds, about 3 seconds, about 5 seconds or about 7 seconds. The reaction chamber may be purged after providing the catalyst into the reaction chamber. Purging is not indicated in FIG. 2A, but it may be optionally included in block 204.

At block 206, a silicon precursor comprising an alkoxy silane is provided into the reaction chamber in a vapor phase. In an exemplary embodiment, the silicon precursor is tetraethoxysilane. The silicon precursor is selectively chemisorbed on the first surface relative to the second surface of the substrate. The silicon precursor may be provided into the reaction chamber (i.e. pulsed) for about 0.2 to 8 seconds, for example, about 0.5 seconds, about 1 second, about 3 seconds or about 5 seconds. In some embodiments, the silicon precursor is provided into the reaction chamber in multiple, such as 2, 4 or 10, consecutive pulses. In some embodiments, the silicon precursor is provided into the reaction chamber in a single pulse for each deposition cycle. The reaction chamber may be purged after a silicon precursor pulse. Purging is not indicated in FIG. 2A, but it may be optionally included in block 206.

At block 208, a plasma is provided into the reaction chamber to generate reactive species for forming material comprising silicon and oxygen on the first surface. The duration of providing plasma into the reaction chamber (i.e. plasma pulse length) may vary depending on, for example, the plasma power and chamber pressure. For example, the plasma pulse length may be from about 0.1 seconds to about 10 seconds, or from about 0.1 seconds to about 2 seconds, or from about 0.2 second to about 5 seconds, or from about 0.5 second to about 5 seconds, such as about 1 or about 1.5 seconds. In an exemplary embodiment using argon plasma and a plasma (RF) power of 30 W and chamber pressure of about 8 Torr, a pulse length of about 1 second, about 2 seconds or about 3 seconds may be used. In an exemplary embodiment, the reactive species are generated from argon plasma. The reactive species react with the chemisorbed silicon precursor to form material comprising silicon and oxygen on the first surface of the substrate. The material comprising silicon and oxygen may comprise, for example, silicon oxide, and/or metal silicates, such as aluminum silicate. The reaction chamber may be purged after a plasma pulse. Purging is not indicated in FIG. 2A, but it may be optionally included in block 208.

The deposition process according to the current disclosure is a cyclic deposition process. Thus, at loop 210, the deposition cycle is initiated again. The deposition cycle may be repeated as many times as needed to deposit a desired amount of material comprising silicon and oxygen on the substrate. For example, the deposition cycle may be performed from 2 to about 1,000 times, or from about 5 to about 500 times, or from about 10 to about 500 times, or from about 50 to 300 times, or from about 5 to about 50 times, or from about 10 to 40 times, for example 30 times. For example, the deposition cycle may be performed about 70 times, about 100 times, about 150 times, about 200 times or about 400 times. Although not depicted in the current disclosure, the process may comprise additional steps, for example refreshing any blocking or passivation that may be necessary for the continued selective deposition.

As indicated above, selective deposition according to the current disclosure may have a broader selectivity window relative to methods known in the art. For example, the temperature during the process may vary. In some embodiments, the deposition (including providing a catalyst into the reaction chamber) is performed at a temperature from about 100° C. to about 450° C., such as at about 200° C., at about 300° C. or at about 350° C.

In some embodiments, the selective deposition of material comprising silicon and oxygen on the first surface does not damage an organic passivation layer present on the second surface. Further, in some embodiments, the material comprising silicon and oxygen is substantially not deposited on an organic passivation layer.

In some embodiments, the material comprising silicon and oxygen deposited according to the current disclosure comprises predominantly, such as at least 60 at. % or at least 80 at. %, silicon and oxygen. The different deposition schemes presented in FIGS. 2A to 2D allow for adjusting the composition of the deposited material according to the needs of an application in question.

Although not depicted in the drawings 2A to 2D, it is possible for the phases of the deposition process to overlap. For example, phases 204 bad 206 may be performed at least partially simultaneously. In some embodiments, phases 206 and 208 are performed at least partially simultaneously.

Figure 2B:
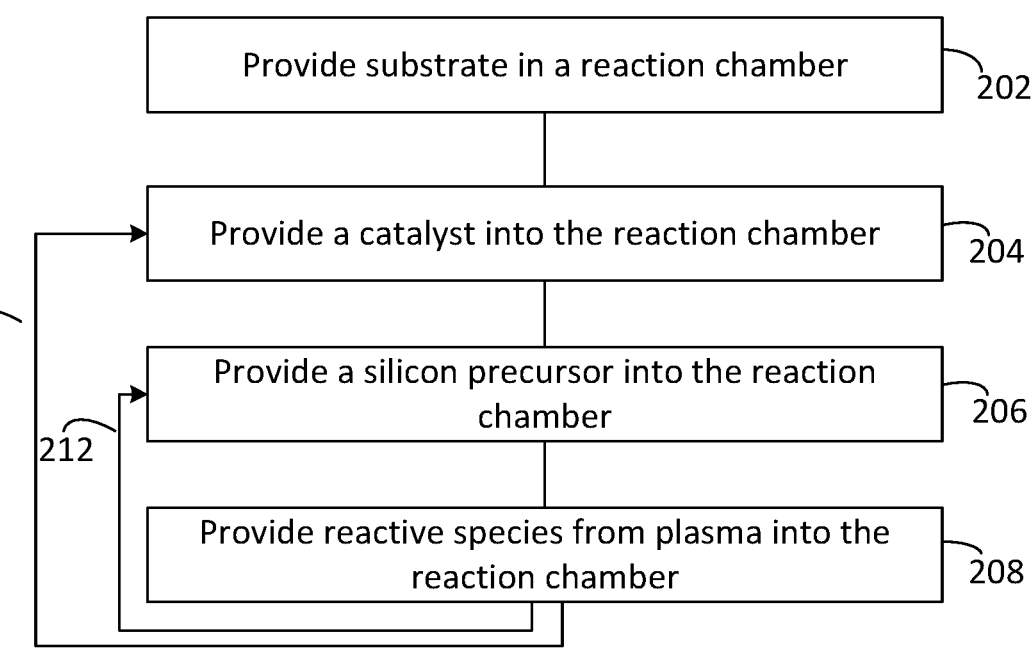
FIG. 2B is a block diagram of exemplary embodiments of a method according to the current disclosure.

FIG. 2B is a block diagram of additional exemplary embodiments of a method according to the current disclosure. Blocks 202, 204, 206 and 208 are performed similarly to the embodiments described in FIG. 2A. In the embodiments of FIG. 2B, blocks 206 and 208 form a silicon and oxygen subcycle that is performed at least 2 times (loop 212) before the master cycle, comprising also block 204, and indicated by loop 210, is repeated. The number of repetitions of the silicon and oxygen subcycle 212 may vary, and the proportion of silicon relative to a metal comprised in the deposited material may be regulated through the selection of the number of subcycles 212 to be performed in each master cycle 210. For example, the silicon and oxygen subcycle could be performed at least twice in each master cycle. In some embodiments, the silicon and oxygen subcycle is performed from 2 to about 50 times, for example about 10 or about 20 or about 30 times, in each master cycle. For example, in embodiments in which the material comprising silicon and oxygen comprises aluminum, the ratio of silicon to aluminum may be increased from less than 0.5 to about 3.5 by increasing the number of silicon and oxygen subcycles from 1 (i.e. similar to the embodiment of FIG. 2A) to about 30. A master cycle may be performed from 1 to about 500 times, depending on the target thickness of the deposited material. In an exemplary embodiment, a master cycle comprises providing an aluminum-comprising catalyst for 3 seconds into the reaction chamber, then performing a silicon and oxygen subcycle 8 times before repeating the master cycle. The master cycle is performed about 100 times to deposit a layer of material comprising silicon and oxygen having a thickness of about 7 to 8 nm. The catalyst in the exemplary embodiment is dimethylaluminum isopropoxide, the silicon precursor is tetraethoxysilane (pulsed for 1 second) and the plasma is argon plasma (pulsed for 0.5 seconds).

Figure 2C:
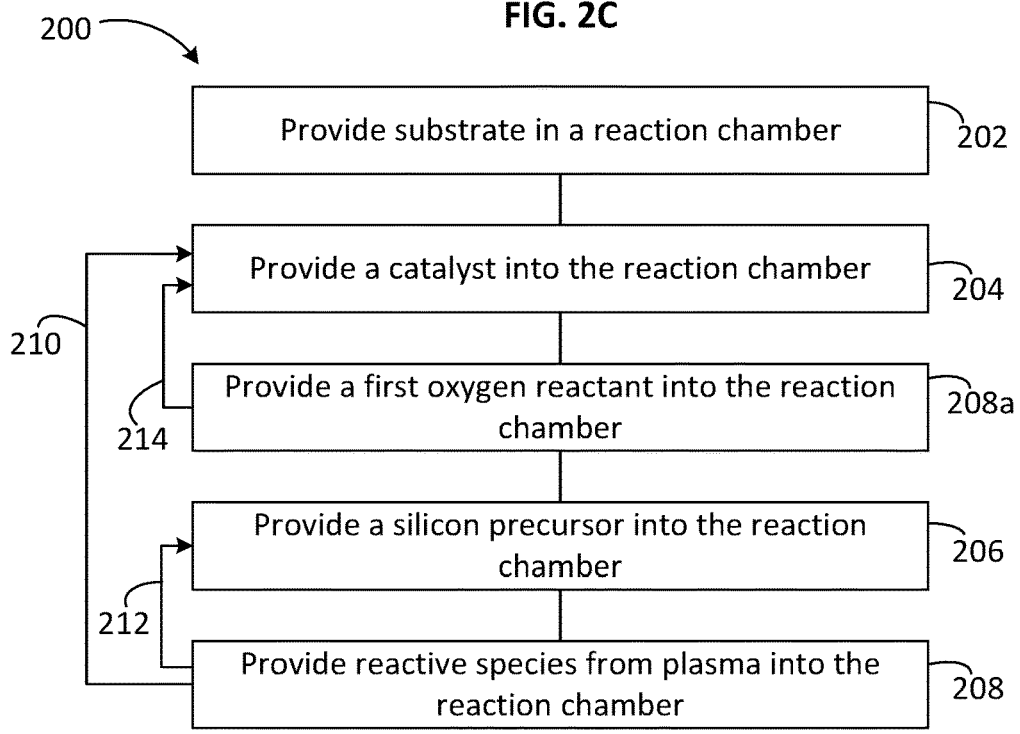
FIG. 2C is a block diagram of exemplary embodiments of a method according to the current disclosure.

FIG. 2C is a block diagram of yet additional exemplary embodiments of a method according to the current disclosure. Blocks 202, 204, 206 and 208 are performed similarly to the embodiments described in FIGS. 2A and 2B. In the embodiments of FIG. 2C, blocks 206 and 208 form a silicon and oxygen subcycle (loop 212) as in the embodiment of FIG. 2B. However, in the embodiments of FIG. 2C, block 204 of providing a catalyst into the reaction chamber is performed with block 208a of providing a first oxygen reactant into the reaction chamber instead of a plasma. Blocks 204 and 208a form a metal oxide subcycle that is repeated fora predetermined number of times (loop 214) before a silicon and oxygen subcycle 212 is performed. Thus, master cycle in the embodiments of FIG. 2C comprises at least one metal oxide subcycle 214 and at least two silicon and oxygen subcycles 212. The number of repetitions of the metal oxide subcycle 214 and the silicon and oxygen subcycle 212 may vary, and the ratio between these two subcycles may be used to adjusting the ratio of metal oxide (such as aluminum oxide) and the material comprising silicon and oxygen deposited during silicon and oxygen subcycle 212. The embodiments of FIG. 2C may be used to deposit nanolaminate structures comprising alternately a metal oxide layer (which may contain also silicon, such a silicon oxide and/or silicates) and a layer comprising silicon and oxygen (which may contain also a metal, such aluminum, in addition to silicon oxide and/or silicates). The thickness of the two layers may be adjusted by changing the proportions of the two subcycles, and this may allow flexible adjusting of the properties of the deposited material. The layers may also be partially or fully mixed. As above, the overall thickness of the deposited material may be adjusted by changing the number of the master cycles performed.

Figure 2D:
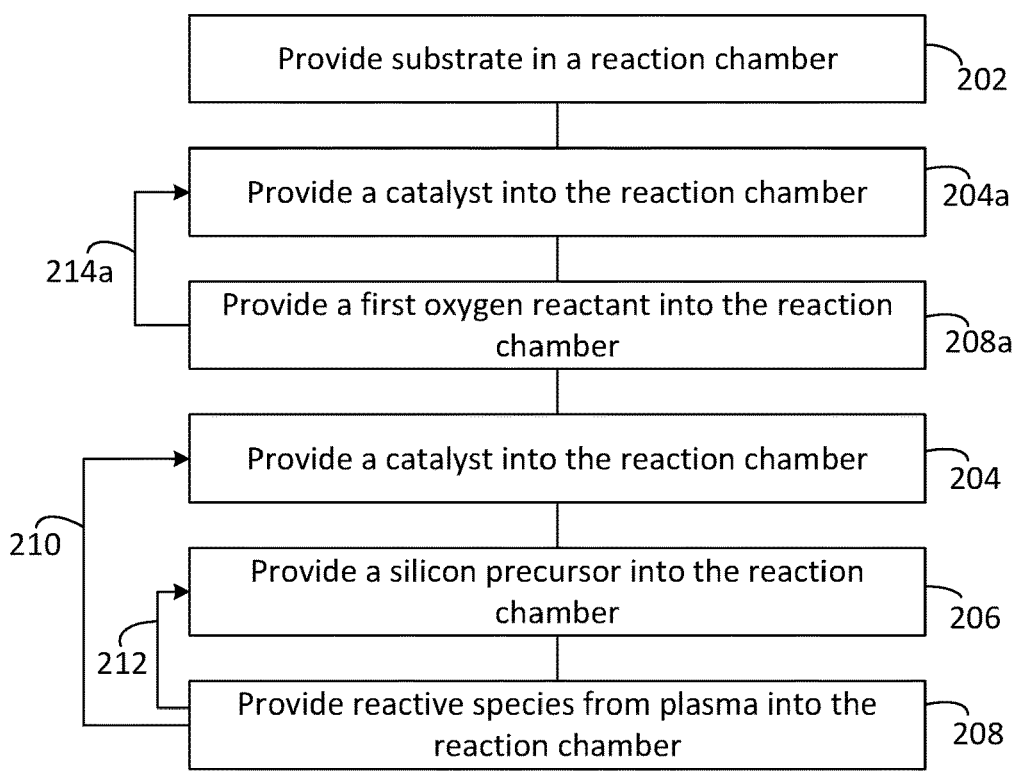
FIG. 2D is a block diagram of exemplary embodiments of a method according to the current disclosure.

FIG. 2D is a block diagram of further exemplary embodiments of a method according to the current disclosure. Blocks 202, 204, 206 and 208 are performed similarly to the previously described embodiments of FIGS. 2A to 2C. In the embodiments of FIG. 2D, an activation treatment (loop 214a) comprising providing a catalyst into the reaction chamber 204a and providing a first oxygen reactant 208a into the reaction chamber is performed before starting the deposition of material comprising silicon and oxygen. The deposition process may comprise providing a catalyst 204 and providing a plasma 208 as a metal oxide subcycle as described under FIG. 2C (loop 214), but the process parameters of the activation treatment 214a are selected independently and may differ from those of the deposition process. The deposition process may be performed according to any of the embodiments described in FIGS. 2A to 2C. An activation treatment may reduce the delay in growth initiation that may be observed in methods according to the current disclosure. In some embodiments (not depicted in FIG. 2D), an activation treatment may comprise a plasma treatment (such as $N_2$/Ar plasma treatment). In some embodiments, a plasma treatment may be performed in addition or as an alternative to the catalyst and oxygen-comprising activation treatment. In addition to reducing growth delay of the material comprising silicon and oxygen, an activation treatment according to the current disclosure may reduce the number of defects, especially on small-pitch structures, and reduce non-uniformities across substrate surface.

An activation treatment may be performed, for example, by providing a catalyst, such as dimethylaluminum isopropoxide, and a first oxygen reactant, such as water, into the reaction chamber alternatively and sequentially. In some embodiments, the reaction chamber is purged after providing the catalyst and after providing the first oxygen reactant into the reaction chamber. The processing conditions, such as temperature, pressure, catalyst pulse length etc., during the activation treatment may be selected independently of the conditions used during the deposition for optimizing the activation treatment. In some embodiments, a temperature during the activation treatment is from about 250° C. to about 400° C., such as from about 300° C. to about 380° C., for example about 340° C. or about 350° C. The purpose of the activation treatment is not to deposit metal oxide on the substrate, as that could adversely influence the performance of layer comprising silicon and oxygen. Instead, without limiting the current disclosure to any specific theory, an activation treatment may amend the properties of the first surface to improve the initiation of growth of material comprising silicon and oxygen. In some embodiments, providing a catalyst and a first oxygen reactant is repeated from 2 to about 35 times, for example from about 8 to 30 times, or from about 12 to about 25 times. Pulse length for catalyst and first oxygen reactant may be selected independently and may vary from 0.1 seconds to about 8 seconds, or from about 1 second to about 6 seconds. Exemplary pulse lengths during an activation treatment are 2 seconds, 3 seconds, 4 seconds or 5 seconds. In some embodiments, water is used as a first oxygen reactant during the activation treatment.

In some embodiments, the activation treatment is performed immediately before the beginning of the deposition. In some embodiments, the activation treatment is performed in the same reaction chamber as the deposition treatment. In some embodiments, the activation treatment is performed in a different deposition station of a multi-station deposition chamber.

Figure 3:
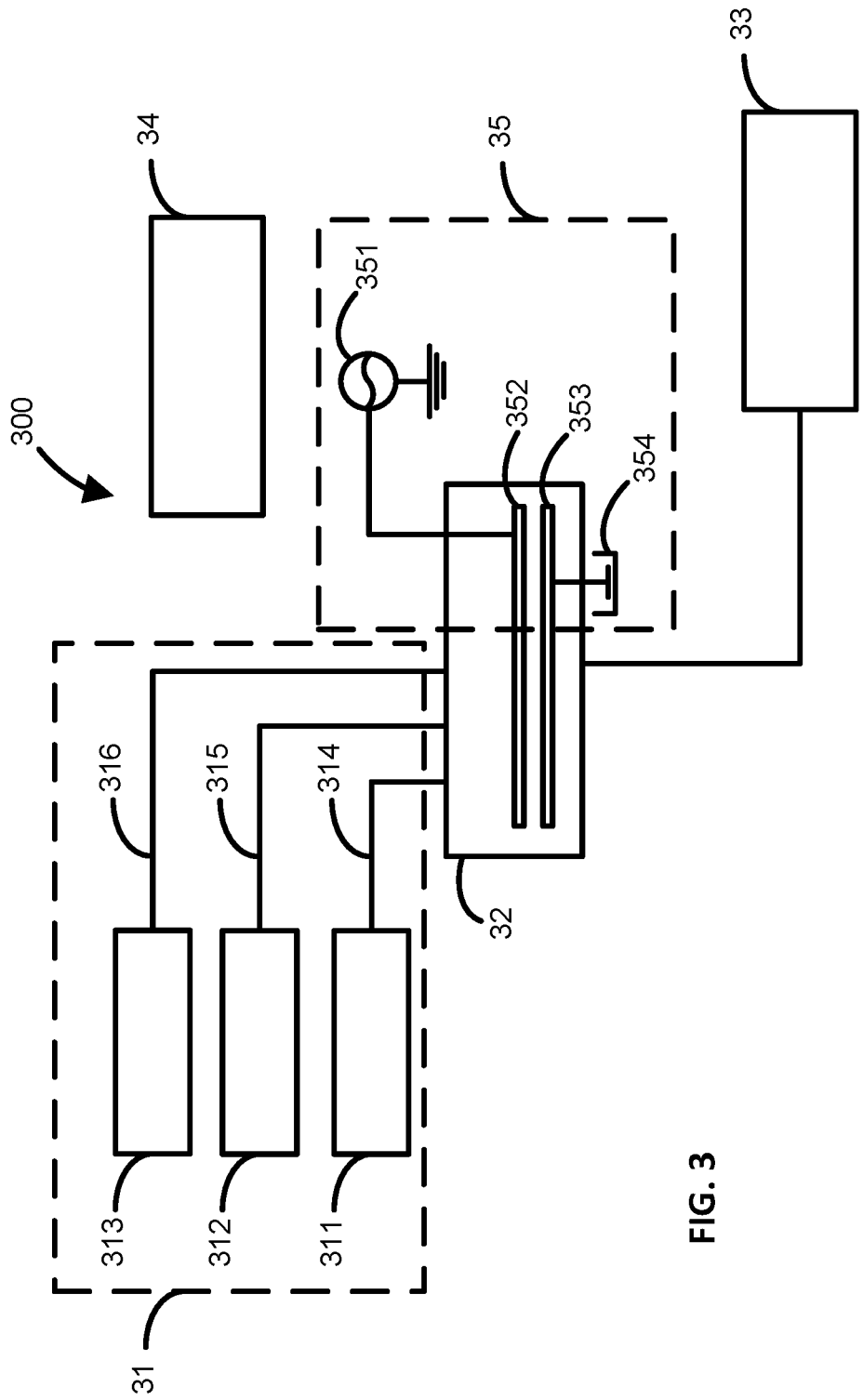
FIG. 3 is a schematic presentation of a deposition assembly according to the current disclosure.

FIG. 3 illustrates a vapor deposition assembly 300 according to the current disclosure in a schematic manner. In one aspect, a deposition assembly for depositing material comprising silicon and oxygen on a substrate is disclosed. The deposition assembly comprises one or more reaction chambers 32 constructed and arranged to hold the substrate, a precursor injector system 31 constructed and arranged to provide a metal or a metalloid catalyst and a silicon precursor into the reaction chamber in a vapor phase, and to provide plasma into the reaction chamber.

The deposition assembly comprises a first reactant vessel 311 constructed and arranged to contain the metal or metalloid catalyst, a second reactant vessel 312 constructed and arranged to contain the silicon precursor, and a third reactant vessel 313 constructed and arranged to contain the plasma precursor. The vapor deposition assembly further comprises a plasma generation system 35. The vapor deposition assembly 300 is constructed and arranged to provide the catalyst, the silicon precursor and the plasma precursor via the precursor injector system 31, and the plasma through the plasma generation system 35, to the reaction chamber 32 to selectively deposit material comprising silicon and oxygen on the first surface of the substrate.

Deposition assembly 300 can be used to perform a method as described herein. In the illustrated example, deposition assembly 300 includes one or more reaction chambers 32, a precursor injector system 31, a first reactant vessel 311, a second reactant vessel 312, a third reactant vessel 313, an exhaust source 33 and a controller 34. The deposition assembly 300 may comprise one or more additional gas sources (not shown), such as a first oxygen reactant source, a second oxygen reactant source, alkoxide enhancer source, an inert gas source, a carrier gas source and/or a purge gas source. In embodiments, in which blocking and/or passivation is performed in the same deposition assembly, the assembly may comprise the corresponding sources.

Reaction chamber 32 can include any suitable reaction chamber, such as an ALD or CVD reaction chamber as described herein.

The first reactant vessel 311 can include a vessel and a catalyst as described herein—alone or mixed with one or more carrier (e.g., inert) gases. A second reactant vessel 312 can include a vessel and a silicon precursor as described herein—alone or mixed with one or more carrier gases. A third reactant vessel 313 can include a plasma precursor as described herein. Thus, although illustrated with three source vessels 311-313, deposition assembly 300 can include any suitable number of reactant vessels. Specifically, in embodiments in which a first oxygen reactant and/or second oxygen reactant and/or an alkoxide enhancer is utilized, the deposition assembly may comprise a corresponding number of additional reactant vessels. Reactant vessels 311-313 can be coupled to reaction chamber 32 via lines 314-316, which can each include flow controllers, valves, heaters, and the like. In some embodiments, each of the catalyst in the first reactant vessel 311, the silicon precursor in the second reactant vessel 312, the plasma precursor in the third reactant vessel 313 and any optional additional reactants in their reactant vessels may be independently heated or kept at ambient temperature. In some embodiments, a reactant vessel is heated so that a precursor or a reactant reaches a suitable temperature for vaporization Exhaust source 33 can include one or more vacuum pumps.

Controller 34 includes electronic circuitry and software to selectively operate valves, manifolds, heaters, pumps and other components included in the deposition assembly 300. Such circuitry and components operate to introduce precursors, reactants and purge gases from the respective sources. Controller 34 can control timing of gas and plasma pulse sequences, temperature of the substrate and/or reaction chamber 32, pressure within the reaction chamber 32, plasma generation, and various other operations to provide proper operation of the deposition assembly 300. Controller 34 can include control software to electrically or pneumatically control valves to control flow of precursors, reactants and purge gases into and out of the reaction chamber 32. Controller 34 can include modules such as a software or hardware component, which performs certain tasks. A module may be configured to reside on the addressable storage medium of the control system and be configured to execute one or more processes.

Other configurations of deposition assembly 300 are possible, including different numbers and kinds of precursor and reactant sources. For example, a reaction chamber 32 may comprise more than one, such as two or four, deposition stations. Such a multi-station configuration may have advantages if, for example, blocking, passivation and/or activation treatment are to be performed in the same chamber. Further, it will be appreciated that there are many arrangements of valves, conduits, precursor sources, and reactant sources that may be used to accomplish the goal of selectively and in coordinated manner feeding gases into reaction chamber 32. Further, as a schematic representation of a deposition assembly, many components have been omitted for simplicity of illustration, and such components may include, for example, various valves, manifolds, purifiers, heaters, containers, vents, and/or bypasses.

The vapor deposition assembly 300 comprises a plasma generation system 35 for generating the plasma used in the processes according to the current disclosure. The plasma generation system 35 may be provided with a RF power source 351 operably connected with the controller, and constructed and arranged to produce a plasma from the selected gas, such as argon, nitrogen, or a combination thereof.

The plasma-enhanced cyclic deposition process according to the current disclosure may be performed using the vapor deposition assembly 300. For example, a pair of electrically conductive flat-plate electrodes 352, 353 in parallel and facing each other in the interior (reaction zone) of the reaction chamber 32 may be provided, RF power (e.g., 13.56

MHz or 27 MHz) from a power source 351 may be provided to one side, and the other side may be electrically grounded 354, leading to excitation of a plasma between the electrodes 352, 353.

A substrate may be placed on the lower electrode 353, the lower electrode 353 thus serving as a susceptor. The lower electrode 353 may also comprise a temperature regulator, keeping a temperature of the substrate placed thereon relatively constant. The upper electrode 352 can serve as a shower plate, and precursor gases and optionally an inert gas(es) and/or purging gases can be introduced into the reaction chamber 32 through gas lines 314-316, respectively, and through the shower plate.

During operation of a deposition assembly 300, substrates, such as semiconductor wafers (not illustrated), are transferred into the reaction chamber 32. Once substrate(s) are transferred to reaction chamber 32, one or more gases from gas sources, such as precursors, carrier gases, and/or purge gases, are introduced into reaction chamber 32. Plasma is generated at suitable points in time to provide reactive species into the reaction chamber for depositing material comprising silicon and oxygen on the first surface of the substrate.

In this disclosure, "gas" can include material that is a gas at normal temperature and pressure (NTP), a vaporized solid and/or a vaporized liquid, and can be constituted by a single gas or a mixture of gases, depending on the context. Precursors according to the current disclosure may be provided to the reaction chamber in gas phase. The term "inert gas" can refer to a gas that does not take part in a chemical reaction and/or does not become a part of a layer to an appreciable extent. Exemplary inert gases include He and Ar and any combination thereof. In some cases, molecular nitrogen and/or hydrogen can be an inert gas. A gas other than a process gas, i.e., a gas introduced without passing through a precursor injector system, other gas distribution device, or the like, can be used for, e.g., sealing the reaction space, and can include a seal gas.

The example embodiments of the disclosure described above do not limit the scope of the invention, since these embodiments are merely examples of the embodiments of the invention, which is defined by the appended claims and their legal equivalents. Any equivalent embodiments are intended to be within the scope of this invention. Various modifications of the disclosure, in addition to those shown and described herein, such as alternative useful combinations of the elements described, may become apparent to those skilled in the art from the description. Such modifications and embodiments are also intended to fall within the scope of the appended claims.

The invention claimed is:

1. A method of selectively depositing material comprising silicon and oxygen on a first surface of a substrate relative to a second surface of the substrate by a cyclic deposition process, the method comprising:
   providing the substrate into a reaction chamber;
   providing a metal or metalloid catalyst into the reaction chamber in a vapor phase, wherein the first surface is selectively silylated, relative to the second surface, by a silyl blocking agent prior to the providing the metal or metalloid catalyst;
   providing a silicon precursor, different from the silyl blocking agent and comprising an alkoxy silane compound, into the reaction chamber in a vapor phase; and
   providing a plasma into the reaction chamber to form a reactive species configured to form the material comprising silicon and oxygen selectively on the first surface relative to the second surface.

2. The method of claim 1, wherein the second surface is selectively passivated, relative to the silylated first surface, by a polymeric passivation agent configured to be blocked by the silyl blocking agent of the silylated first surface.

3. The method of claim 1, wherein the first surface is a dielectric surface.

4. The method of claim 3, wherein the dielectric surface comprises silicon.

5. The method of claim 1, wherein the catalyst is a metal halide, organometallic compound or metalorganic compound.

6. The method of claim 1, wherein the catalyst comprises trimethyl aluminum (TMA), dimethylaluminumchloride, aluminum trichloride ($AlCl_3$), dimethylaluminum isopropoxide (DMAI), tris(tertbutyl)aluminum (TTBA), tris(isopropoxide)aluminum (TIPA), tris(dimethylamino) aluminum (TDMAA) or triethyl aluminum (TEA).

7. The method of claim 1, wherein the alkoxy silane compound is selected from a group consisting of tetraacetoxysilane, tetramethoxysilane, tetraethoxysilane, trimethoxysilane, triethoxysilane and trimethoxy(3-methoxypropyl)silane.

8. The method of claim 1, wherein the plasma is generated from a noble gas selected from a group consisting of helium, neon and argon.

9. The method of claim 8, wherein the plasma is additionally generated from an element selected from a group consisting of hydrogen and nitrogen.

10. The method of claim 1, wherein plasma ion energy does not exceed 160 eV.

11. The method of claim 1, wherein the process further comprises providing a first oxygen reactant into the reaction chamber in a vapor phase after the providing the catalyst into the reaction chamber, wherein the first oxygen reactant comprises oxygen and hydrogen.

12. The method of claim 1, wherein the process comprises providing a second oxygen reactant into the reaction chamber in a vapor phase at least partially simultaneously with providing the silicon precursor into the reaction chamber.

13. The method of claim 1, wherein a pressure during a deposition cycle process is lower than about 20 Torr.

14. The method of claim 1, wherein a pressure during a deposition cycle process is higher than about 5 Torr.

15. The method of claim 1, further comprising an activation treatment before deposition of material comprising silicon and oxygen, wherein the activation treatment comprises providing a catalyst into the reaction chamber in a vapor phase; and providing a first oxygen reactant into the reaction chamber in a vapor phase.

16. The method of claim 15, wherein the catalyst and the first oxygen reactant are provided into the reaction chamber cyclically.

17. The method of claim 1, wherein the material comprising silicon and oxygen comprises silicon oxide, aluminum silicate and/or silicon oxycarbide.

18. The method of claim 1, wherein the first surface is silylated with a silylating agent selected from the group consisting of:
   allyltrimethylsilane (TMS-A);
   chlorotrimethylsilane (TMS-Cl);
   N-(trimethylsilyl)imidazole (TMS-Im);
   octadecyltrichlorosilane (ODTCS);
   hexamethyldisilazane (HMDS); or
   N-(trimethylsilyl)dimethylamine (TMSDMA).

19. A method of selectively depositing material comprising silicon and oxygen on a first surface of a substrate relative to a second surface of the substrate by a cyclic deposition process, the method comprising:
- providing the substrate into a reaction chamber;
- providing a silylation agent into the reaction chamber to selectively silylate the first surface relative to the second surface;
- providing a polymeric passivation agent into the reaction chamber in a vapor phase to selectively passivate the second surface relative to the silylated first surface;
- providing a metal or metalloid catalyst into the reaction chamber in a vapor phase, wherein the polymeric passivation agent is configured to selectively block deposition of the metal or metalloid catalyst; and
- performing a silicon and oxygen subcycle, said subcycle comprising alternately and sequentially providing a silicon precursor comprising an alkoxy silane compound into the reaction chamber in a vapor phase and providing a plasma into the reaction chamber to form a reactive species for forming material comprising silicon and oxygen on the first surface.

20. The method of claim 19, further comprising heat-treating the passivated second surface prior to providing the metal or metalloid catalyst into the reaction chamber.

21. A method of selectively depositing material comprising silicon and oxygen on a first surface of a substrate relative to a second surface of the substrate by a cyclic deposition process, the method comprising:
- providing the substrate into a reaction chamber;
- performing a metal oxide subcycle, said metal oxide subcycle comprising providing alternately and sequentially a metal or metalloid catalyst and a first oxygen reactant comprising oxygen and hydrogen into the reaction chamber in a vapor phase, wherein the metal or metalloid catalyst does not comprise silicon; and
- performing a silicon and oxygen subcycle, said silicon and oxygen subcycle comprising alternately and sequentially providing a silicon precursor comprising an alkoxy silane compound into the reaction chamber in a vapor phase and providing a plasma into the reaction chamber to form a reactive species for forming material comprising silicon and oxygen on the first surface.

22. The method of claim 21, wherein the first oxygen reactant comprises water.

* * * * *